US012633343B2

(12) United States Patent     (10) Patent No.:   US 12,633,343 B2

Zurla et al.        (45) Date of Patent:   *May 19, 2026

---

(54) IN-MEMORY COMPUTATION DEVICE HAVING AN IMPROVED CURRENT READING CIRCUIT AND CONTROL METHOD

(71) Applicant: STMicroelectronics S.r.l., Agrate Brianza (IT)

(72) Inventors: Riccardo Zurla, Binasco (IT); Marco Pasotti, Travaco' Siccomario (IT); Marcella Carissimi, Bergamo (IT); Alessandro Cabrini, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 206 days.

This patent is subject to a terminal disclaimer.

(21) Appl. No.: 18/543,847

(22) Filed: Dec. 18, 2023

(65) Prior Publication Data

US 2024/0212751 A1     Jun. 27, 2024

(30) Foreign Application Priority Data

Dec. 23, 2022    (IT) ........................ 102022000026745

(51) Int. Cl.
    *G11C 13/00*      (2006.01)
    *G06F 17/16*      (2006.01)

(52) U.S. Cl.
    CPC ............ *G11C 13/004* (2013.01); *G06F 17/16* (2013.01); *G11C 13/0004* (2013.01);
          (Continued)

(58) Field of Classification Search
    CPC .............. G11C 13/004; G11C 13/0004; G11C 13/0028; G11C 13/003; G11C 2213/79;
          (Continued)

(56) References Cited

U.S. PATENT DOCUMENTS 8,699,273 B2    4/2014   Bingoga
8,902,678 B2   12/2014   Dimartino et al.
         (Continued)

FOREIGN PATENT DOCUMENTS

WO    2021137894 A1    7/2021
WO    2021158861 A1    8/2021

OTHER PUBLICATIONS

IT Search Report and Written Opinion for priority application, IT Appl. 102022000026745, report dated Jun. 20, 2023, 9 pgs.
         (Continued)

*Primary Examiner* — Jerome Leboeuf
(74) *Attorney, Agent, or Firm* — Crowe & Dunlevy LLC

(57) ABSTRACT

A word line activation unit of an in-memory computation generates activation signals as a function of an input value. The in-memory computation device includes a memory array with a plurality of memory cells (each storing a computational weight) coupled to a bit line and each to a word line and a digital detector. A cell current flows through each memory cell as a function of the activation signal and the computational weight and a bit line current is generated as a function of a summation of the cell currents. The digital detector performs successive iterations on the bit line current. In each iteration: an integration stage generates an integration signal indicative of a time integral of the bit line current, and resets the integration signal when the integration signal reaches a threshold; and the counter stage updates the output signal in response to the integration signal reaching the threshold.

16 Claims, 12 Drawing Sheets

(52) U.S. Cl.
CPC ........ *G11C 13/0028* (2013.01); *G11C 13/003*
(2013.01); *G11C 2213/79* (2013.01)

(58) Field of Classification Search
CPC ............ G11C 11/54; G11C 2013/0045; G11C
13/0026; G11C 2013/0071; G11C
13/0069; G11C 7/1006; G06F 17/16;
G06N 3/065; G06N 3/063
See application file for complete search history.

(56) References Cited

U.S. PATENT DOCUMENTS

| | | | |
|---|---|---|---|
| 8,953,360 | B2 | 2/2015 | Bedeschi |
| 9,396,795 | B1 | 7/2016 | Jeloka et al. |
| 9,508,446 | B1 | 11/2016 | Chen et al. |
| 9,859,008 | B1 | 1/2018 | Kim |
| 9,887,011 | B1 | 2/2018 | Hung |
| 10,056,145 | B2 | 8/2018 | Backhausen et al. |
| 10,073,733 | B1 | 9/2018 | Jain et al. |
| 10,319,449 | B1 | 6/2019 | Yang |
| 10,373,682 | B2 | 8/2019 | Parkinson et al. |
| 10,636,481 | B1 | 4/2020 | Chang et al. |
| 10,643,677 | B2 | 5/2020 | Yabe |
| 10,692,570 | B2 | 6/2020 | Al-Shamma |
| 10,762,958 | B2 | 9/2020 | Pyo et al. |
| 10,831,446 | B2 | 11/2020 | Chen et al. |
| 10,943,652 | B2 | 3/2021 | Lu et al. |
| 11,024,393 | B1 | 6/2021 | Zhang et al. |
| 11,043,259 | B2 | 6/2021 | Wentzlaff et al. |
| 11,061,646 | B2 | 7/2021 | Sumbul et al. |
| 11,100,987 | B1 | 8/2021 | Mantegazza et al. |
| 2017/0263306 | A1 | 9/2017 | Murphy |
| 2018/0260696 | A1 | 9/2018 | Suda et al. |
| 2019/0279709 | A1 | 9/2019 | Lee |
| 2020/0233923 | A1* | 7/2020 | Knag ....................... G11C 8/08 |
| 2021/0033648 | A1 | 2/2021 | Khaddam-Aljameh et al. |
| 2021/0035636 | A1 | 2/2021 | Nazarian |
| 2021/0134343 | A1 | 5/2021 | Li et al. |
| 2021/0271597 | A1 | 9/2021 | Verma et al. |
| 2021/0279036 | A1 | 9/2021 | Li et al. |
| 2021/0334639 | A1 | 10/2021 | Tran |
| 2021/0342671 | A1 | 11/2021 | Hoang et al. |
| 2021/0343320 | A1 | 11/2021 | Horng et al. |
| 2021/0349689 | A1 | 11/2021 | Lu et al. |
| 2022/0004852 | A1* | 1/2022 | Ju ........................... G11C 11/54 |
| 2022/0012586 | A1 | 1/2022 | Lin et al. |
| 2022/0028445 | A1 | 1/2022 | Park et al. |
| 2022/0044099 | A1 | 2/2022 | Conte et al. |
| 2022/0068380 | A1 | 3/2022 | Carissimi et al. |
| 2024/0055033 | A1 | 2/2024 | Hsu et al. |
| 2024/0212730 | A1* | 6/2024 | Carissimi .............. G06N 3/065 |
| 2024/0212751 | A1 | 6/2024 | Zurla et al. |
| 2024/0404594 | A1 | 12/2024 | Carissimi et al. |

OTHER PUBLICATIONS

Biswas, et al: "CONV-SRAM: An Energy-Efficient SRAM With In-Memory Dot-Product Computation for Low-Power Convolutional Neural Networks," IEEE Journal of Solid-State Circuits 54, No. 1, Dec. 17, 2018, pp. 217-230.

Chi, et al: "PRIME: A Novel Processing-In-Memory Architecture for Neural Network Computation in ReRAM-Based Main Memory," ACM SIGARCH Computer Architecture News 44, No. 3, Jun. 18, 2016, pp. 27-39.

Lelmini, Daniele et al: "Device and Circuit Architectures for In-Memory Computing," Advanced Intelligent Systems, Sep. 2020, 19 pages.

Mittal, Sparsh: "A Survey of ReRAM-Based Architectures for Processing-In-Memory and Neural Networks," Machine Learning and Knowledge Extractions 1, No. 1, Mar. 2019, pp. 75-114.

Xie, Chenchen, et al: "Speeding Up the Write Operation for Multi-Level Cell Phase Change Memory with Programmable Ramp-Down Current Pules," Micromachines 2019, www.mdpi.com/journal/micromachines, 13 pages.

Khaddam-Aljameh R et al: "Hermes Core—A 14NM CMOS and PCM-Based in Memory Compute Core Using an Array of 300PS/LSB Linearized CCO-Based ADCS and Local Digital Processing", 2021 Symposium on VLSI Circuits Digest of Technocal Papers, 3 pgs.

Mayahinia Mahta et al: "A Voltage-Controlled, Oscillation-Based ADC Design for Computation-in-Memory Architectures Using Emerging ReRAMs," ACM Journal on Emerging Technologies in Computing Systems, vol. 18, No. 2, Article 32, Pub date Mar. 2022, 26 pgs.

Zhang Xueyong et al: "A 0.11-0.38 pJ/cycle Differential Ring Oscillator in 65 nm CMOS for Robust Neurocomputing," IEEE Transactions on Circuits and Systems—I: Regular Papers, vol. 68, No. 2, Feb. 2021, 15 pgs.

* cited by examiner

1

IN-MEMORY COMPUTATION DEVICE HAVING AN IMPROVED CURRENT READING CIRCUIT AND CONTROL METHOD

PRIORITY CLAIM

This application claims the priority benefit of Italian Application for Patent No. 102022000026745 filed on Dec. 23, 2022, the content of which is hereby incorporated by reference in its entirety to the maximum extent allowable by law.

TECHNICAL FIELD

The present invention relates to an in-memory computation device having an improved current reading circuit and to a control method.

BACKGROUND

As is known, an in-memory computation device uses the specific arrangement of the memory cells of a memory array to perform an analog data processing at the cell level.

For example, in-memory computation devices are used to perform multiply and accumulate (MAC) operations, which are for example employed to implement machine learning algorithms, such as neural networks.

A multiply and accumulate operation provides an output vector $y_1, \ldots, y_M$ as the multiplication of an input vector $x_1, \ldots, x_N$ by a vector or matrix of computational weights $g_{ij}$, e.g.:

$$\begin{bmatrix} y_1 \\ y_2 \\ \vdots \\ y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} x_1 \\ x_2 \\ \vdots \\ x_n \end{bmatrix},$$

i.e.: $$\begin{cases} y_1 = g_{11} \cdot x_1 + g_{12} \cdot x_2 + \cdots + g_{1N} \cdot x_N \\ y_2 = g_{21} \cdot x_1 + g_{22} \cdot x_2 + \cdots + g_{2N} \cdot x_N \\ \vdots \\ y_M = g_{M1} \cdot x_1 + g_{M2} \cdot x_2 + \cdots + g_{MN} \cdot x_N \end{cases}.$$

The in-memory computation device stores the computational weights $g_{ij}$ in the cells of the memory and performs the multiplication and summation operations at the cell level.

In detail, for each output vector $y_1$, the known in-memory devices generate a current indicative of $$\sum\nolimits_{i=1}^{i=M} g_{ij} \cdot x_j$$

and comprise a reading circuit having a respective analog-to-digital converter (ADC) that discretizes said current.

The in-memory computation devices allow to avoid back and forth transfer of data between a memory and an elaboration unit. Accordingly, the performance of an in-memory computation device is not limited by the data transfer bandwidth between memory and elaboration unit and has a low power consumption.

However, it is noted that the ADCs of the known in-memory computation devices have a high die occupation area and a slow conversion time, thereby causing high manufacturing costs and low performances of the corresponding in-memory computation devices.

There is a need to overcome the disadvantages of the prior art.

SUMMARY

According to the present invention, an in-memory computation device and a control method thereof are provided.

In an embodiment, Aa in-memory computation device is configured to receive an input signal indicative of a plurality of input values and to provide at least one output signal. The in-memory computation device comprises: a word line activation unit configured to receive the input signal and to provide a plurality of activation signals, each being a function of a respective input value; a memory array comprising a plurality of memory cells coupled to a bit line and coupled each to a respective word line, the memory cells being configured to store each a respective computational weight and to receive each a respective activation signal from the respective word line, the memory cells being configured to be flown through each by a respective cell current that is a function of the respective activation signal and the respective computational weight, the bit line being configured to be flown through by a bit line current that is a summation of the cell currents; and a digital detector coupled to the bit line and configured to provide the at least one output signal from the bit line current.

The digital detector comprises an integration stage and a counter stage configured to perform a number of successive sampling iterations, wherein, in each sampling iteration: the integration stage is configured to generate an integration signal indicative of a time integral of the bit line current, compare the integration signal with a sampling threshold, and reset the integration signal in response to the integration signal reaching the sampling threshold; and the counter stage is configured to update the output signal in response to the integration signal reaching the sampling threshold.

In an embodiment, a method is provided for controlling an in-memory computation device that is configured to receive an input signal indicative of a plurality of input values and to provide at least one output signal. The in-memory computation device comprises a word line activation circuit, a memory array and a digital detector, the digital detector being coupled to the bit line and comprising an integration stage and a counter stage), the memory array comprising a plurality of memory cells coupled to a bit line and coupled each to a respective word line, the memory cells being configured to store each a respective computational weight and to receive each a respective activation signal from the respective word line, the memory cells being configured to be flown through each by a respective cell current that is a function of the respective activation signal and the respective computational weight, the bit line being configured to be flown through by a bit line current that is a summation of the cell currents.

The method comprises: providing, by the word line activation circuit, a plurality of activation signals to the memory cells, each activation signal being a function of a respective input value; and performing, by the digital detector, a number of successive sampling iterations. Each sampling iteration comprises, by the integration stage: generating an integration signal indicative of a time integral of the bit line current; comparing the integration signal with a sampling threshold; and resetting the integration signal in response to the integration signal reaching the sampling threshold.

Each sampling iteration further comprises, by the counter stage, updating the output signal in response to the integration signal reaching the sampling threshold.

BRIEF DESCRIPTION OF THE DRAWINGS

For a better understanding of the present invention, non-limiting embodiments are now described, with reference to the attached drawings, wherein.

DETAILED DESCRIPTION

Figure 1:
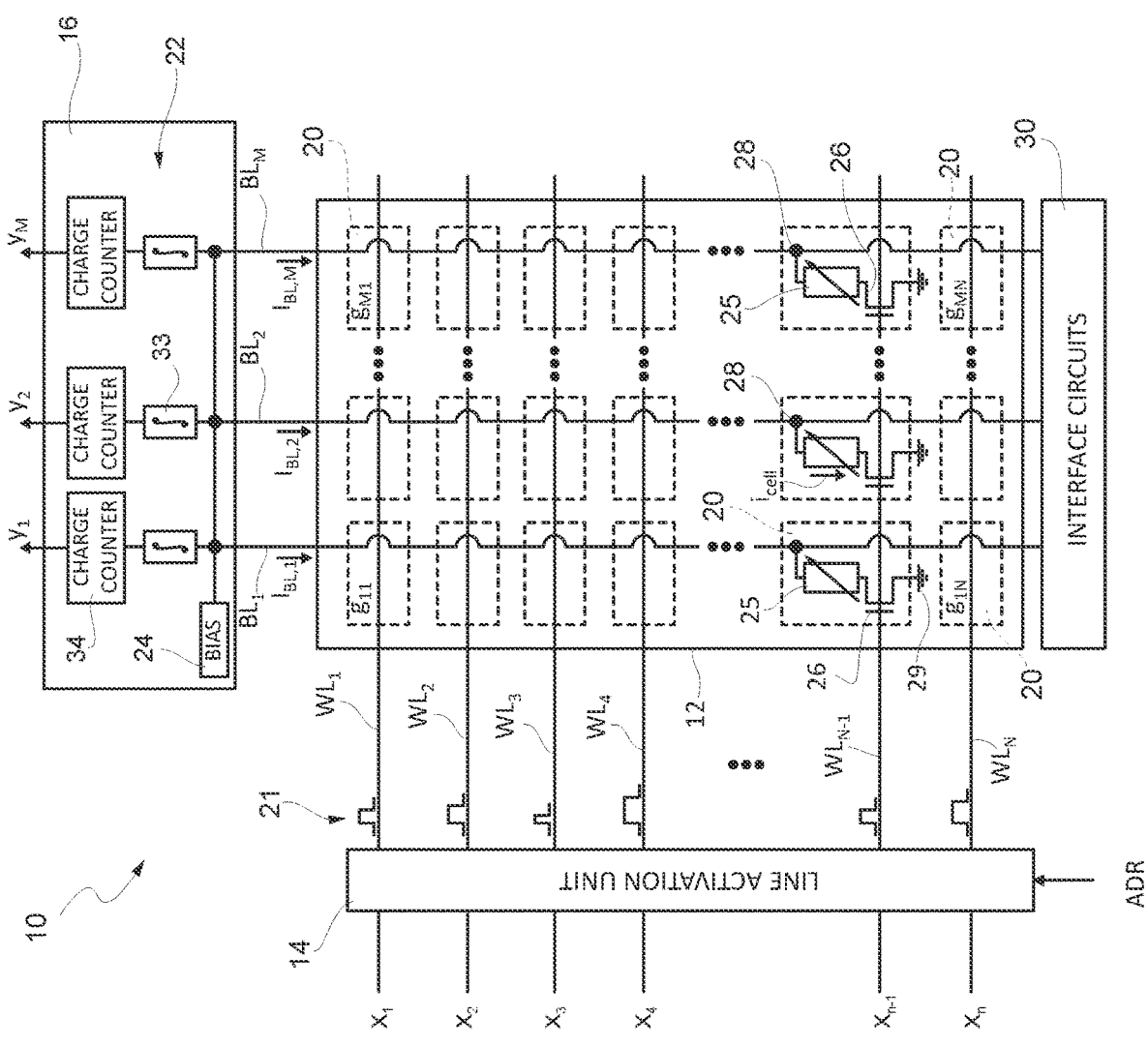
FIG. 1 shows a block diagram of the present in-memory computation device.

FIG. 1 shows a circuit diagram of an in-memory computation device 10, hereinafter also referred to as IMC device 10, comprising a computation memory array (hereinafter indicated as memory array) 12, a line activation unit 14 and a reading unit 16.

In FIG. 1, only the elements that are useful for understanding the present embodiment are shown, whereas elements and components that may be present in the final IMC device 10 and are not relevant for understanding the invention are not shown.

The memory array 12 is of the non-volatile type and comprises a plurality of memory cells 20 organized in a matrix arrangement having M columns and N rows.

The memory cells 20 arranged in the same column are mutually connected through a respective bit line $BL_i$, wherein $i=1, \ldots, M$. The memory cells 20 arranged in the same row are mutually connected through a respective word line $WL_j$, wherein $j=1, \ldots, N$.

In practice, a respective word line $WL_j$ and a respective bit line $BL_i$ are associated to each memory cell 20.

The memory cells 20 are programmed to store each a respective computational weight $g_{ij}$ that may be used as a weight for performing an in-memory calculation.

The line activation unit 14 provides a plurality of word line activation signals 21, one for each word line $WL_j$, that are configured to each activate the memory cells 20 of a respective word line $WL_j$.

In this embodiment, the line activation unit 14 receives an input vector X including a plurality of input values $x_1, \ldots, x_N$, one for each word line $WL_j$. The word line activation signals 21 are pulses, in particular here rectangular pulses, each having a time width that is a function of the respective input value $x_j$.

The line activation unit 14 further receives an address signal ADR indicating which word lines $WL_j$ to activate for performing an in-memory calculation. For example, the address signal ADR may be used to cause the activation, in use, only of some of the plurality of word lines $WL_1, \ldots, WL_N$, for example if the input vector X has a number of values smaller than the number N of rows of the memory array 12.

The reading unit 16 comprises a plurality of digital detectors 22 and a biasing circuit 24.

The biasing circuit 24 provides a bias voltage Vr to the bit lines $BL_1, \ldots, BL_M$.

In this embodiment, the biasing circuit 24 provides the same voltage Vr to all the bit lines $BL_1, \ldots, BL_M$. However, the biasing circuit 24 may provide bias voltages different with each other to the bit lines $BL_1, \ldots, BL_M$, depending on the specific application.

The digital detectors 22 are each coupled to a respective bit line $BL_i$ and each provides an output signal $y_i$ indicative of a current $I_{BL,i}$ flowing through the respective bit line $BL_i$, as discussed hereinafter in detail.

The memory cells 20 each comprise a storing element 25 and a selection element 26.

The storing element 25 of each memory cell 20 is a variable resistive element, in particular here based on a phase change material (PCM), such as a chalcogenide.

In detail, the computational weight $g_{ij}$ indicates the transconductance value of the storing element 25 of the respective memory cell 20, i.e. it is indicative of the programmed resistance of the storing element 25.

A phase change material has at least two phase states, e.g. an amorphous phase and a crystalline phase, each having a respective resistivity.

A phase change material may be transformed from one phase state to another by means of heat transfer, for example by using current pulses.

The resistance of each storing element 25 associated to the respective phase state is used to distinguish two or more logic states of the corresponding memory cell 20.

For example, the amorphous phase may have a higher resistance than the crystalline phase. A logic state '0', or reset state, may be associated to the amorphous phase of the storing element 25. A logic state '1', or set state, may be associated to the crystalline phase of the storing element 25.

The storing element 25 has a first terminal coupled to a node 28 of the respective bit line $BL_i$ and a second terminal coupled to a reference potential node, here to ground 29, through the selection element 26.

The selection element 26 is a switch, for example a BJT transistor, a diode or a MOS transistor, here an NMOS transistor, that is arranged in series with the respective storing element 25 and whose switching is controlled by the word line activation signal 21 of the respective word line $WL_j$.

In this embodiment, the NMOS transistor forming the selection element 26 has a source coupled to, here directly connected to, the ground 29; a drain coupled to, here directly connected to, the second terminal of the storing element 25; and a gate coupled to, here directly connected to, the respective word line $WL_j$.

In practice, the storing element 25 and the selection element 26 form a current path of the respective memory cell 20; the selection element 26, in response to receiving the respective activation signal 21, closes the respective current path, thereby allowing the passage of a cell current $i_{cell}$ from the common node 28 to the ground 29.

The IMC device 10 may further comprise interface circuits 30 coupled to the bit lines $BL_1, \ldots, BL_M$ that may be used, for example, to program the transconductance values $g_{ij}$ stored in the storing elements 25, in a per se known way.

The digital detectors 22 each comprise an integration stage 33 and a counter stage 34 for each bit line $BL_i$.

Figure 2:
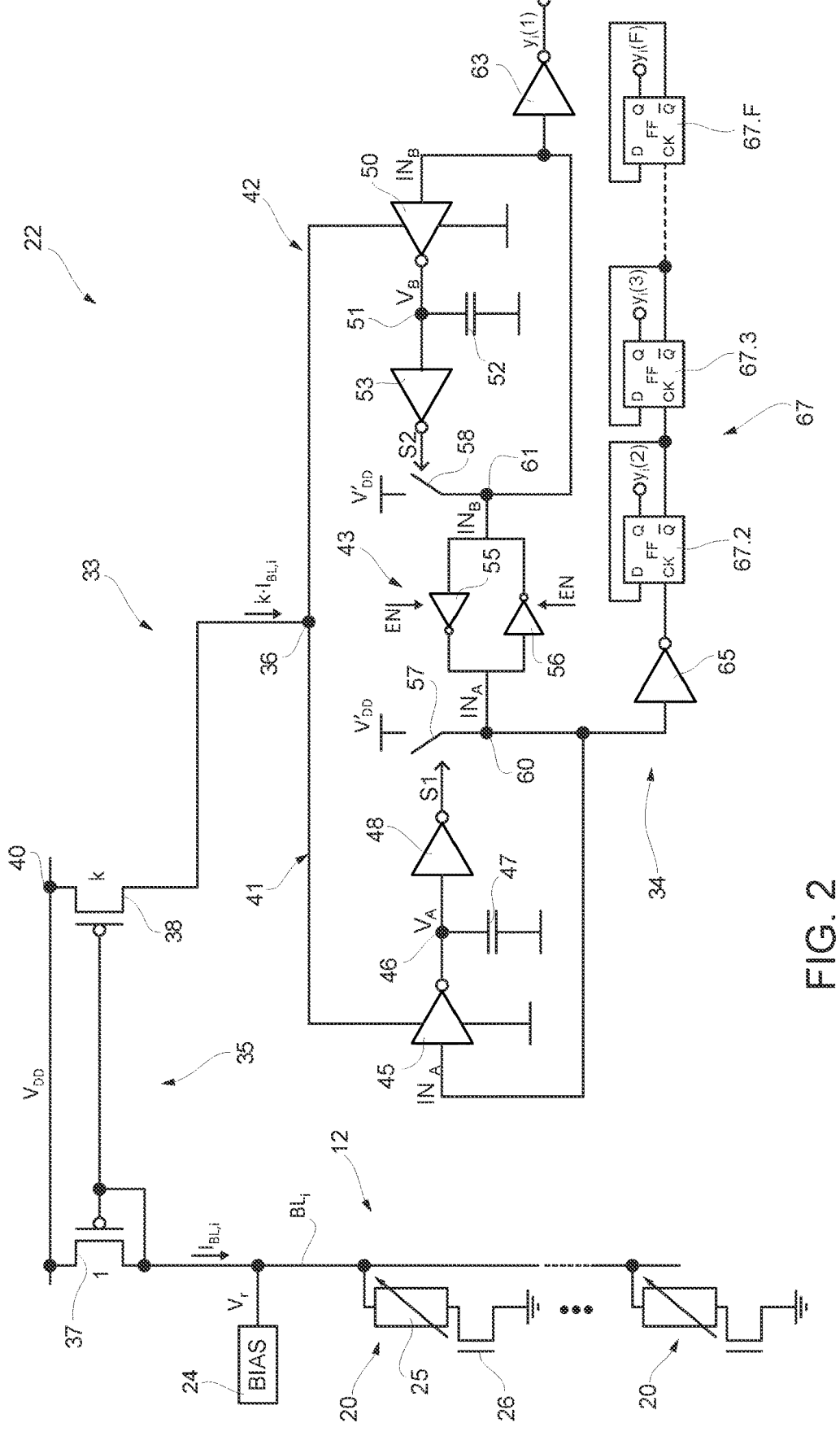
FIG. 2 shows a circuit diagram of a digital detector of the in-memory computation device of FIG. 1.
Figures 3, 4:
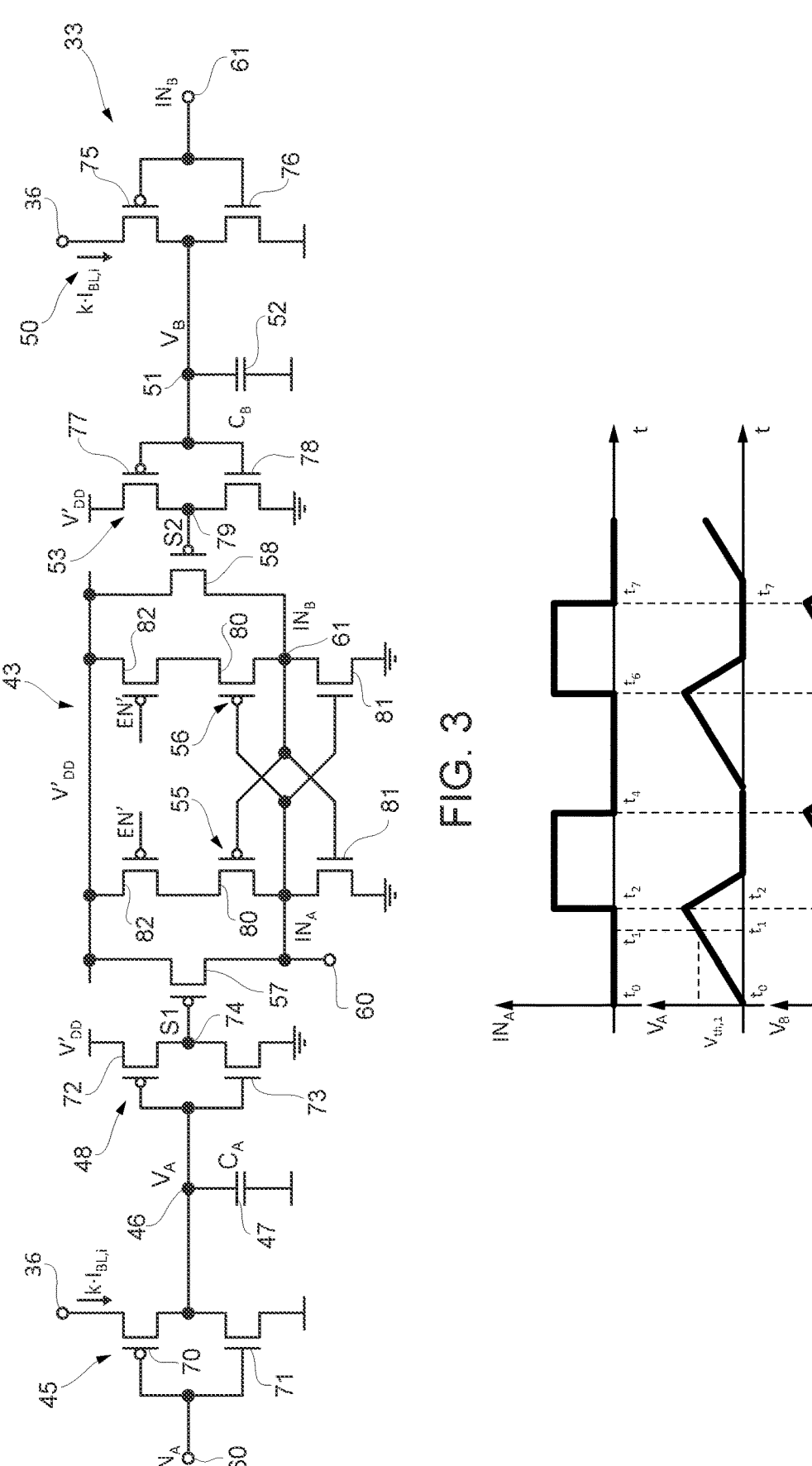
FIG. 3 shows a detailed circuit diagram of a portion of the digital detector of FIG. 2.
FIG. 4 shows an example of waveforms of the digital detector of FIG. 2, in use.

With reference to FIGS. 2 and 3, the digital detectors 22 will be described hereinafter with respect to the digital detector 22 coupled to a generic bit line $BL_i$ of the plurality of bit lines $BL_1, \ldots, BL_M$.

In this embodiment, the integration stage 33 comprises a current mirror 35 that mirrors the bit line current $I_{BL,i}$ of the bit line $BL_i$ into an input node 36 of the respective integration stage 33.

The current mirror 35 has a mirroring ratio 1:k, so that a mirrored bit line current $k \cdot I_{BL,i}$ flows through the input node 36 of the integration stage 33.

In detail, the current mirror 35 has a first branch, here formed by a respective PMOS transistor 37, coupled to the bit line $BL_i$, and a second branch, here formed by a respective PMOS transistor 38, coupled to the respective integration stage 33.

The sources of the PMOS transistors 37, 38 are coupled to a supply node 40, here at a voltage $V_{DD}$, the gates of the PMOS transistors 37, 38 are mutually coupled together and to the drain of the PMOS transistor 37. The drain of the PMOS transistor 38 is coupled to, in particular here is directly connected to, the input node 36 of the integration stage 33.

The integration stage 33 comprises a first integration circuit 41, a second integration circuit 42, and a switching circuit 43 coupled between the first and the second integration circuits 41, 42.

The first and the second integration circuits 41, 42 are coupled to the input node 36 so as to receive the mirrored bit line current $k \cdot I_{BL,i}$.

The first integration circuit 41 comprises a first inverter 45 having an output 46, a capacitor 47 of capacitance $C_A$ coupled at the output 46 of the first inverter 45, and a second inverter 48 whose input is coupled to the output 46 of the first inverter 45.

The first inverter 45 has a supply node coupled to the input node 36 of the integration stage 33 (FIG. 3) and receives at input a first control signal $IN_A$.

In practice, the first inverter 45 is biased by the mirrored bit line current $k \cdot I_{BL,i}$.

The capacitor 47 has a first terminal coupled to the output node 46 of the first inverter 45 and a second terminal coupled to a reference potential node, here to ground.

The output node 46 of the first inverter 45 is at a first integration voltage $V_A$ that drops across the capacitor 47.

The second inverter 48 has a first sampling threshold, hereinafter referred to as first threshold $V_{th1}$, receives at input the first integration voltage $V_A$ and provides at output a first switch signal S1 as a function of the first threshold $V_{th1}$ and the first integration voltage $V_A$.

In detail, the first switch signal S1 is a logic signal having a high logic value when the first integration voltage $V_A$ is smaller than the first threshold $V_{th1}$, and a low logic value when the first integration voltage $V_A$ is higher than the first threshold $V_{th1}$.

The second integration circuit 42 comprises a first inverter 50 having an output 51, a capacitor 52 of capacitance $C_B$ coupled at the output 51 of the first inverter 50, and a second inverter 53 whose input is coupled to the output 51 of the first inverter 50.

The first inverter 50 has a supply node coupled to the input node 36 of the integration stage 33 (FIG. 3) and receives at input a second control signal $IN_B$.

In practice, the first inverter 50 is biased by the mirrored bit line current $k \cdot I_{BL,i}$.

The capacitor 52 has a first terminal coupled to the output node 51 of the first inverter 50 and a second terminal coupled to a reference potential node, here to ground.

The output node 51 of the first inverter 50 is at a second integration voltage $V_B$ dropping across the capacitor 51.

The second inverter 53 has a second sampling threshold $V_{th2}$, hereinafter referred to as second threshold $V_{th2}$, receives at input the second integration voltage $V_B$ and provides at output a second switch signal S2 as a function of the second threshold $V_{th2}$ and the second integration voltage $V_B$.

In detail, the second switch signal S2 is a logic signal having a high logic value when the second integration voltage $V_B$ is smaller than the second threshold $V_{th2}$, and a low logic value when the second integration voltage $V_B$ is higher than the second threshold $V_{th2}$.

In this embodiment, the first threshold $V_{th1}$ is equal to the second threshold $V_{th2}$; however, the first threshold $V_{th1}$ may be different to the second threshold $V_{th2}$, depending on the specific application.

The switching circuit 43 is a latch formed by two inverters 55, 56 arranged in a ring configuration, a first switch 57 controlled by the first switch signal S1 and a second switch 58 controlled by the second switch signal S2.

The switching circuit 43 has a first node 60 coupled to the input of the inverter 56 and the output of the inverter 55, and a second node 61 coupled to the output of the inverter 56 and the input of the inverter 55.

The first node 60 provides the first control signal $IN_A$. The second node 61 provides the second control signal $IN_B$.

The first switch 57 is coupled between the first node 60 and a node at a voltage $V'_{DD}$, the second switch 58 is coupled between the second node 61 and the node at the voltage $V'_{DD}$.

The voltage $V'_{DD}$ may be equal or different to the voltage $V_{DD}$ of the supply node 40. For example, if the voltage $V'_{DD}$ is different, in particular smaller, than the voltage $V_{DD}$, the digital detector 22 may comprise a voltage scaling circuit, for example a transistor, here not shown, whose source and drain terminals are coupled between the supply node 40 and the input node 36 of the integration stage 33.

In this embodiment, the switching circuit 43 also receives an enable signal EN, which controls the activation of the switching circuit 43. For example, the enable signal EN may be used to keep the switching circuit 43 off when not in use, thereby allowing to optimize power consumption. In addition, the enable signal EN may be used to set the switching circuit 43 in a defined state, for example upon turning on of the IMC device 10.

The charge counter stage 34 is coupled to the first and the second nodes 60, 61 of the switching circuit 43.

In detail, the charge counter stage 34 comprises an inverter 63, whose input is coupled to the second node 61, and a counter comprising an inverter 65 whose input is coupled to the first node 60 and a plurality of D flip-flops 67 including a first flip-flop 67.2, a second flip-flop 67.3 and a last flip-flop 67.F, wherein F is the number of bits of the output signal $y_i$. In practice, the counter of the charge counter stage 34 has F−1 flip-flops 67.

The output of the inverter 63 provides the first bit $y_i(1)$, i.e. the least significant bit, of the output signal $y_i$.

In other words, the output of the inverter 63 may be used, at the end of a calculation performed by the IMC device 10, as the least significant bit $y_i(1)$ of the output signal $y_1$.

The flip-flops 67 are cascaded one with the other, in sequence from the first flip-flop 67.2 to the last flip-flop 67.F.

The flip-flops 67 each have a clock input (CK-input), a data input (D-input), a Q-output, and a Q̄-output.

The CK-input of the first flip-flop 67.2 is coupled to the output of the inverter 65. The Q-output of the first flip-flop 67.2 is fed back to the D-input of the first flip-flop 67.2. The Q-output of the first flip-flop 67.2 forms the second bit $y_i(2)$ of the output signal $y_i$.

The CK-input of the second flip-flop 67.3 is coupled to the Q̄-output of the first flip-flop 67.2. The Q̄-output of the second flip-flop 67.3 is fed back to the D-input of the second flip-flop 67.3. The Q-output of the second flip-flop 67.3 forms the third bit $y_i(2)$ of the output signal $y_i$.

What is described for the second flip-flop 67.3 applies, mutatis mutandis, to all the subsequent flip-flops, here not shown, up to the F−1-th flip-flop, also not shown.

Finally, the CK-input of the last flip-flop 67.F is coupled to the Q̄-output of the F−1-th flip-flop. The Q̄-output of the last flip-flop 67.F is fed back to the D-input of the last flip-flop 67.F. The Q-output of the last flip-flop 67.F forms the most significant bit $y_i(F)$ of the output signal $y_i$.

With reference to the detailed implementation of the integration stage 33 shown in FIG. 3, the first inverter 45 of the first integration circuit 41 is a CMOS inverter formed by the series circuit of a PMOS transistor 70 and an NMOS transistor 71, mutually coupled at the output node 46. The PMOS and NMOS transistors 70, 71 receive the first control signal $IN_A$ at the respective gate terminals.

The source of the PMOS transistor 70 is coupled to the input node 36 of the integration stage 33.

The second inverter 48 of the first integration circuit 41 is a CMOS inverter formed by the series circuit of a PMOS transistor 72 and an NMOS transistor 73, mutually coupled at a node 74 providing the first switch signal S1.

The first threshold $V_{th1}$ of the second inverter 48 is the switching threshold of the second inverter 48, and therefore depends on the properties, for example the threshold or the on-resistance, of the PMOS and NMOS transistors 72, 73. In practice, the switching threshold may be the input voltage for which the output of the inverter has the high logic value or the input voltage for which the output of the inverter has the low logic value.

For example, the switching threshold of the second inverter 48 may be defined as the operating point at which the respective input voltage, i.e. the first integration voltage $V_A$, is equal to the respective output voltage, i.e. the first switch signal S1.

The first inverter 50 of the second integration circuit 42 is a CMOS inverter formed by the series circuit of a PMOS transistor 75 and an NMOS transistor 76, mutually coupled at the output node 51. The PMOS and NMOS transistors 75, 76 receive the second control signal $IN_B$ at the respective gate terminals.

The source of the PMOS transistor 75 is coupled to the input node 36 of the integration stage 33.

The second inverter 53 of the second integration circuit 42 is a CMOS inverter formed by the series circuit of a PMOS transistor 77 and an NMOS transistor 78, mutually coupled at a node 79 providing the second switch signal S2.

The second threshold $V_{th2}$ of the second inverter 53 is the switching threshold of the second inverter 53, i.e. depends on the properties of the PMOS and NMOS transistors 77, 78. For example, the switching threshold depends on the gate-source voltage that allows a current to flow through the source-drain path of the PMOS and NMOS transistors 77, 78.

As shown in the detailed implementation of FIG. 3, the first and the second inverters 55, 56 of the switching circuit 43 are cross-coupled CMOS inverters each comprising a respective PMOS transistor 80 and a respective NMOS transistor 81 mutually coupled in series between a supply node, here at the voltage $V'_{DD}$, and ground.

Moreover, the first and the second inverters 55, 56 of the switching circuit 43 also comprise each a respective enabling switch, here a PMOS transistor 82, that is coupled between the supply node at the voltage $V'_{DD}$ and the PMOS transistor 80 of the respective inverter.

The PMOS transistors 82 are controlled by the enabling signal EN.

In use, the bit line current $I_{BL,i}$ of the bit line $BL_i$ is mirrored into the integration stage 33 of the respective digital detector 22.

FIG. 4 shows an example of the time behavior of the first control signal $IN_A$, the first integration voltage $V_A$ and the second integration voltage $V_B$ of the digital detector 22 of FIG. 2.

For $t_0 < t < t_1$, the first integration voltage $V_A$ is below the first threshold $V_{th1}$.

Accordingly, the PMOS transistor 72 of the second inverter 48 is on and the NMOS transistor 73 of the second inverter 48 is off. Therefore, the first switch signal S1 (here not shown) has the high value and the first switch 57 is open. The first control signal $IN_A$ has the low value.

It follows that, with respect to the first inverter 45 of the first integration circuit 41, for $t_0 < t < t_1$, the PMOS transistor 70 is on and the NMOS transistor 71 is off.

At the same time, for $t_0 < t < t_1$, the second control signal $IN_B$ has the high value. Therefore, with respect to the first inverter 50 of the second integration circuit 42, for $t_0 < t < t_1$, the PMOS transistor 75 is off and the NMOS transistor 76 is on.

Accordingly, the mirrored bit line current $k \cdot I_{BL,i}$ flows, from the input node 36, only through the first inverter 45 of the first integration circuit 41 and not through the first inverter 50 of the second integration circuit 42.

In detail, the mirrored bit line current $k \cdot I_{BL,i}$ flows through the PMOS transistor 70 and charges the capacitor 47. The first integration voltage $V_A$ thus increases in time for $t_0 < t < t_1$.

In detail, in the example of FIG. 4, the first integration voltage $V_A$ increases linearly in time for $t_0 < t < t_1$; however, the behavior of the first integration voltage $V_A$ depends on the specific behavior of the bit line current $I_{BL,i}$ in the time interval $t_0 < t < t_1$.

When the first integration voltage $V_A$ becomes equal to the first threshold voltage $V_{th1}$, the NMOS transistor 73 of the second inverter 48 turns on and the PMOS transistor 72 turns off.

In this embodiment, the first control signal $IN_A$ assumes the high value at a time instant $t_2$.

The time delay between instants $t_1$ and $t_2$ may correspond, for example, to the propagation delay of the second inverter 48 of the first integration circuit 41 and/or the switching time of the first switch 57.

For $t_1 < t < t_2$, the mirrored bit line current $I_{BL,i}$ keeps charging the capacitor 47; accordingly, the first integration voltage $V_A$ increases up to a maximum value (instant $t_2$).

At the time instant $t_2$, when the first control signal $IN_A$ assumes the high value, the second control signal $IN_B$ (here not shown) assumes the low value (the inverter 56 of the switching circuit 43 receives the first control signal $IN_A$ at input).

While the first control signal $IN_A$ has the high value, the PMOS transistor 70 and the NMOS transistor 71 of the first inverter 45 of the first integration circuit 41 are off and, respectively, on. At the same time, while the second control signal $IN_B$ has the low value, the PMOS transistor 75 and the NMOS transistor 76 of the first inverter 50 of the second integration circuit 42 are on and, respectively, off.

Therefore, for $t > t_2$, the mirrored bit line current $k \cdot I_{BL,i}$ flows, from the input node 36, only through the first inverter 50 of the second integration circuit 42 and not through the first inverter 45 of the first integration circuit 41.

In detail, the mirrored bit line current $k \cdot I_{BL,i}$ flows through the PMOS transistor 75 and charges the capacitor 52 of the second integration circuit 42. The second integration voltage $V_B$ thus increases in time from the time instant $t_2$.

In detail, in the example of FIG. 4, the second integration voltage $V_B$ increases linearly in time for $t > t_2$; however, the behavior of the second integration voltage $V_B$ depends on the specific behavior of the bit line current $I_{BL,i}$.

While the first control signal $IN_A$ has the high value, the capacitor 47 of the first integration circuit 41 discharges through the NMOS transistor 71 of the first inverter 45. The first integration voltage $V_A$ thus decreases to zero.

When the second integration voltage $V_B$ becomes equal to the second threshold voltage $V_{th,2}$ (time instant $t_3$), the NMOS transistor 78 of the second inverter 53 turns on and the PMOS transistor 77 turns off.

Accordingly, at a time instant $t_4$, the second control signal $IN_B$ assumes the high value, similarly to what has been discussed above for the first control signal $IN_A$ in correspondence of time instant $t_2$.

In detail, in response to the second integration voltage $V_B$ reaching the second threshold $V_{th,2}$, the second switch signal S2 switches to the low value and the second switch 58 closes, so that the second node 61 is at the voltage $V'_{DD}$ and, accordingly, the second control signal $IN_B$ assumes the high value.

The time delay between instants $t_3$ and $t_4$ may correspond, for example, to the propagation delay of the second inverter 53 of the second integration circuit 42 and/or the switching time of the second switch 58.

For $t_3 < t < t_4$, the mirrored bit line current $k \cdot I_{BL,i}$ keeps charging the capacitor 52 of the second integration circuit 42; accordingly, the second integration voltage $V_B$ increases up to a maximum value (instant $t_4$).

For $t_2 < t < t_4$, the switching circuit 43 keeps the first control signal $IN_A$ at the high value and the second control signal $IN_B$ at the low value.

At the time instant $t_4$, the first control signal $IN_A$ assumes the low value again, in response to the second control signal $IN_B$ assuming the high value.

In response to the first control signal $IN_A$ assuming the low value, the mirrored bit line current $k \cdot I_{BL,i}$ returns to charging the capacitor 47 of the first integration circuit 41 up to a time instant $t_6$, similarly to what has been discussed for $t_1 < t < t_2$.

Consequently, from time instant $t_6$ to time instant $t_7$, the mirrored bit line current $k \cdot I_{BL,i}$ charges the capacitor 52 of the second integration circuit 42 up to a time instant $t_7$, similarly to what has been discussed for $t_2 < t < t_4$.

Again with reference to FIG. 2, the counter stage 34, in particular the flip-flops 67, counts the number of switching events of the first control signal $IN_A$, in particular in this embodiment counts the number of rising edges of the first control signal $IN_A$.

In practice, the digital detectors 22 each measure the bit line current $I_{BL,i}$ of the respective bit line $BL_i$ by performing a number of successive sampling iterations. In each sampling iteration, for example with respect to a sampling iteration wherein the mirrored bit line current $k \cdot I_{BL,i}$ flows through the first integration circuit 41, the integration stage 33 generates the first integration voltage $V_A$ as the time integral of the mirrored bit line current $k \cdot I_{BL,i}$, compares the first integration voltage $V_A$ with the first threshold $V_{th,1}$ and, in response to the first integration voltage $V_A$ reaching the first threshold $V_{th,1}$, resets the first integration voltage $V_A$, in particular here by switching the first control signal $IN_A$. The counter stage 34 updates the respective output signal $y_1$ in response to the first integration voltage $V_A$ reaching the first threshold $V_{th,1}$.

In this embodiment, the least significant bit of the output signal $y_1$ is the value of the second control signal $IN_B$ at the end of the computation performed by the IMC device 10.

In other words, the digital detectors 22 sample each the respective bit line current $I_{BL,i}$ by converting the bit line current $I_{BL,i}$ into a number of charge packets and counting said charge packets, wherein each charge packet corresponds to the charge accumulated on the capacitors 47, 52 that causes a switch of the second inverters 48, 53.

It follows that the capacitors 47, 52 may have a small capacitance if compared to a case wherein the bit line current is integrated all at once onto a single capacitor of capacitance $C_{tot}$.

In detail, the capacitance of the capacitors 47, 52 may be smaller than the capacitance $C_{tot}$ by a factor $2^F$, wherein F is the number of bits of the output signal $y_1$.

Therefore, the digital detectors 22 may have a low die area occupancy and, accordingly, the IMC device 10 may have low manufacturing costs.

In addition, the digital detectors 22 each start discretizing the respective bit line current $I_{BL,i}$ while the bit line current $I_{BL,i}$ flows through the respective bit line $BL_i$. Therefore, the output signal $y_i$ may be ready soon after an end of a computation performed by the IMC device 10 or soon after the respective bit line current $I_{BL,i}$ stops.

For example, according to an embodiment, the digital detectors 22 may sample each the respective bit line current $I_{BL,i}$ until the digital detectors 22 receive a stop signal, for example from a user of the IMC device 10 or from the word line activation unit 14, indicating the end of the computation performed by the IMC device 10.

Therefore, the digital detectors 22 may have a fast measurement time, thereby allowing the IMC device 10 to have a low computation time.

Moreover, according to the illustrated embodiment, the switching circuit 43 disables the first integration circuit 41 and enables the second integration circuit 42, in response to the first integration signal $V_A$ reaching the first threshold $V_{th,1}$, and enables the first integration circuit 41 and disables the second integration circuit 42, in response to the second integration signal $V_B$ reaching the second threshold $V_{th,2}$.

This allows the bit line current $I_{BL,i}$ to be sampled alternatively by the first integration circuit 41 and the second integration circuit 42, thereby allowing the bit line current $I_{BL,i}$ to charge the capacitor 47 while the capacitor 52 is discharging, and to charge the capacitor 52 while the capacitor 47 is discharging. By doing so, no charge may be lost during the sampling and the digital detector 22 may achieve a high measurement accuracy of the bit line current $I_{BL,i}$.

The IMC device 10 may be used to perform a multiply and accumulate (MAC) operation, in particular between the input vector $X = x_1, \ldots, x_N$ and the matrix formed by the computational weights $g_{ij}$.

In fact, the cell current $i_{cell}$ that each memory cell 20 sinks, here from the respective node 28 to ground 29 depends on the transconductance $g_{ij}$ of the respective storing element 25 and the activation time of the respective selection element 26, i.e. on the pulse length of the respective word line activation signal 21.

In detail, the absolute value of each cell current $i_{cell}$ depends on the respective transconductance value $g_{ij}$. The time duration of each cell current $i_{cell}$ depends on the respective activation time.

Accordingly, an electric charge may be associated to each cell current $i_{cell}$; said electric charge is a function of the respective transconductance value $g_{ij}$ and the respective activation time.

Since the pulse length of the word line activation signals 21 is a function of the respective input value $x_j$, the electric charge associated to each cell current $i_{cell}$ is a function of the product $g_{ij} \cdot x_j$.

For each bit line $BL_i$, the respective bit line current $I_{BL,i}$ is a summation of the cell currents $i_{cell}$. Therefore, the total electric charge associated to each bit line current $I_{BL,i}$ is a function of the multiply and accumulate operation $g_{i1} \cdot x_1 + g_{i2} \cdot x_2 + \ldots + g_{iN} \cdot x_N$.

Accordingly, each output signal $y_i$, which is obtained by measuring the respective bit line current $I_{BL,i}$, in particular by integrating the respective bit line current $I_{BL,i}$, is indicative of the MAC operation $g_{i1} \cdot x_1 + g_{i2} \cdot x_2 + \ldots + g_{iN} \cdot x_N$.

Figure 5:
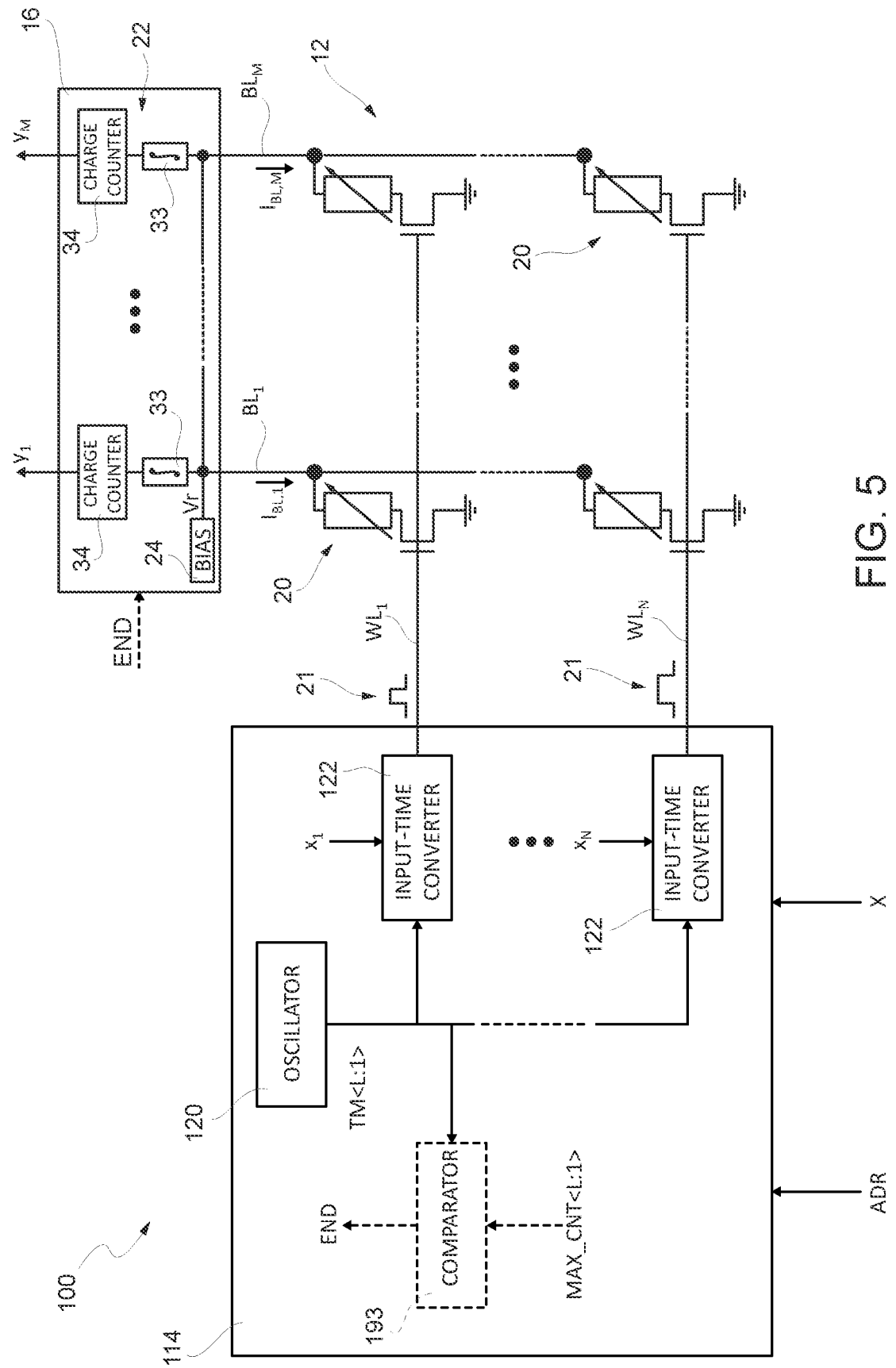
FIG. 5 shows a block diagram of the present in-memory computation device.

FIG. 5 shows a different embodiment of the present IMC device, here indicated by 100. The IMC device 100 has a general structure similar to IMC device of FIG. 1; therefore, elements in common are indicated by the same reference numbers and are not further described in detail.

The IMC device 100 comprises the memory array 12, here shown only in part, a line activation unit 114 and the reading unit 16.

The memory array 12 comprises the memory cells 20 each coupled to a respective bit line $BL_i$, with $i = 1, \ldots, M$, and a respective word line $WL_j$, with $j = 1, \ldots, N$.

The reading unit 16 comprises also here the biasing circuit 24 and the digital detectors 22.

The word line activation unit 114 receives the input signal X including the plurality of input values $x_1, \ldots, x_N$, and provides the plurality of word line activation signals 21 each as a function of a respective input value $x_j$.

In detail, the line activation circuit 114 comprises an oscillator 120 providing a timer signal TM<L:1> having L bits, and a plurality of comparators 122, one for each word line $WL_1, \ldots, WL_N$. The plurality of comparators 122 receive each the timer signal TM<L:1> and a respective input value $x_j$ and, in response, provide a respective word line activation signal 21.

Figure 6:
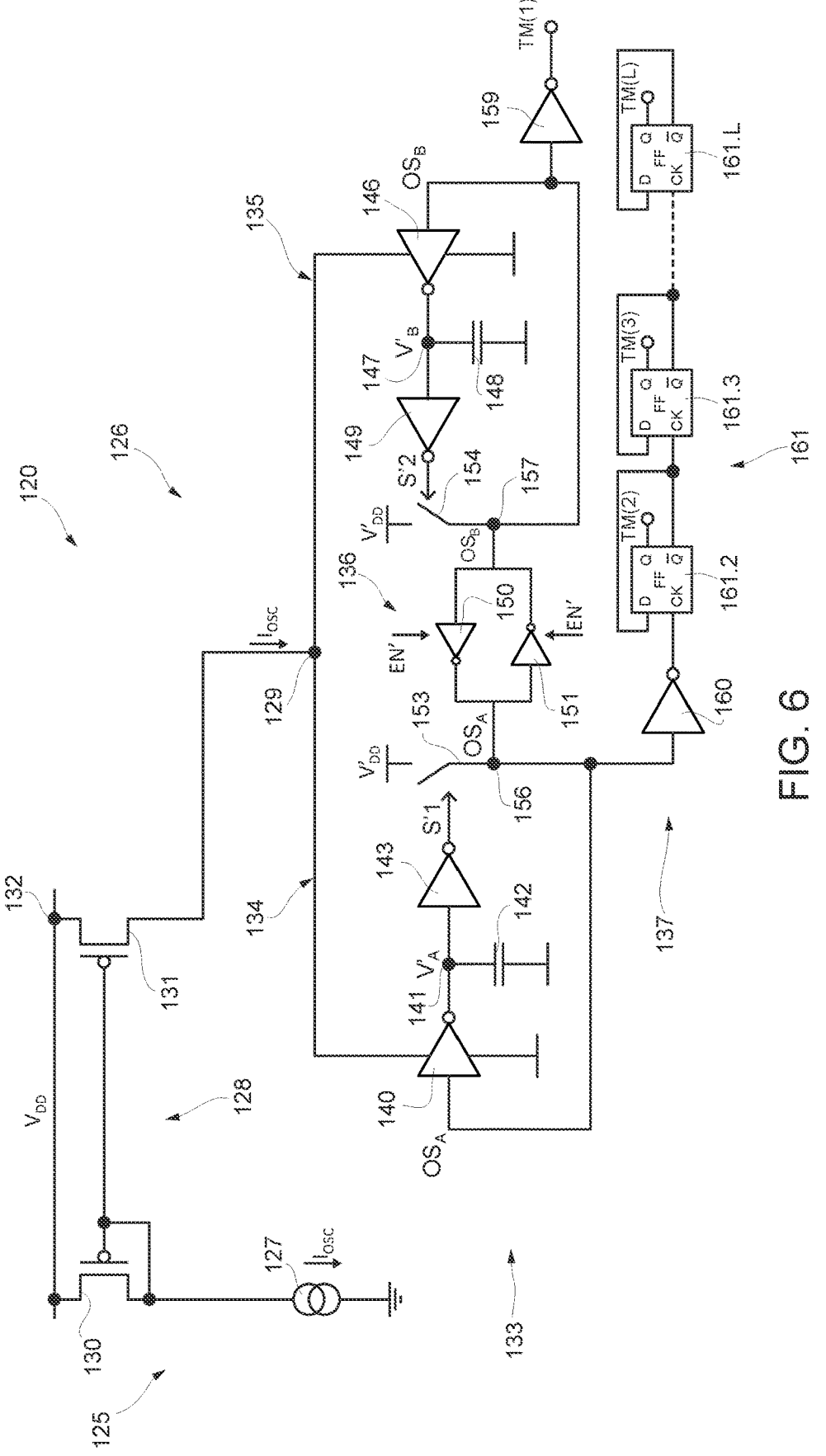
FIG. 6 shows a circuit diagram of an oscillator of the in-memory computation device of FIG. 5.
Figure 7:
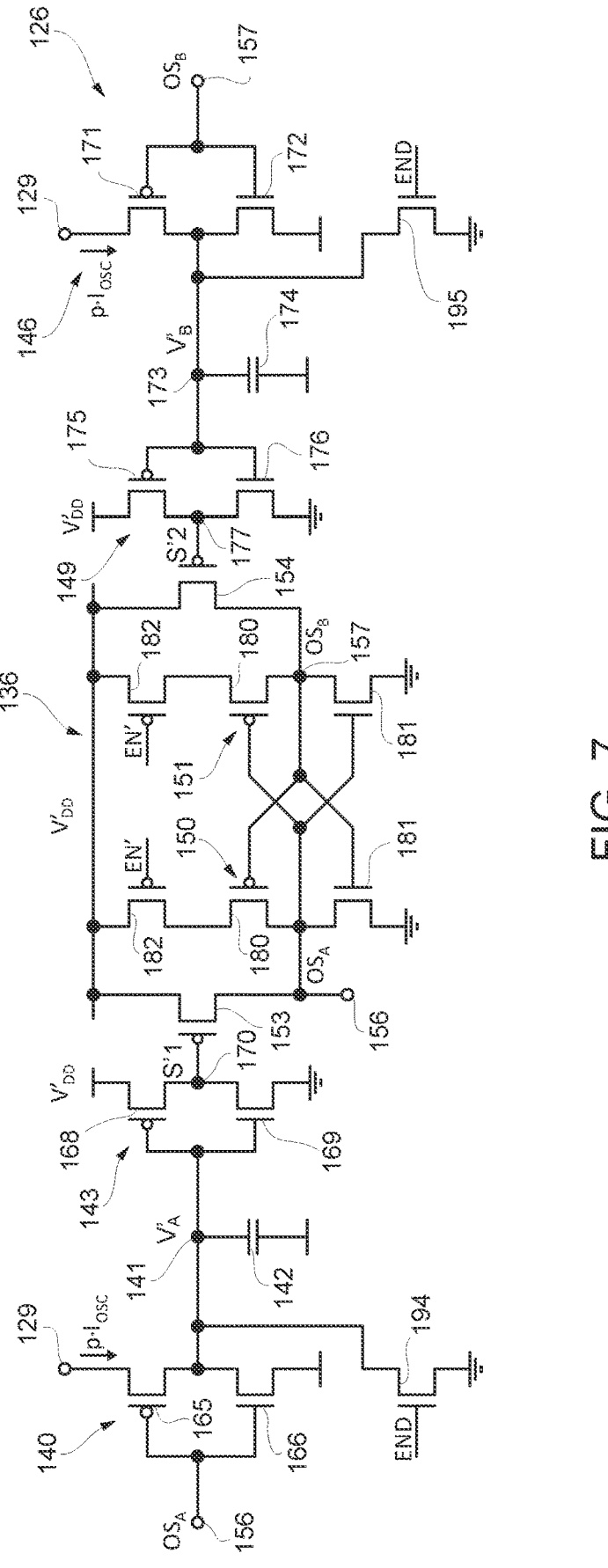
FIG. 7 shows a detailed circuit diagram of a portion of the oscillator of FIG. 6.

The oscillator 120, shown in detail in FIGS. 6 and 7, comprises a current generation portion 125 generating an oscillator current, here a mirrored current $p \cdot I_{OSC}$, and a counting portion 126 that generates the timer signal TM<L: 1>from the oscillator current.

In detail, the current generation portion 125 comprises a current source 127 generating a supply current $I_{OSC}$ and a current mirror 128 that mirrors the supply current $I_{OSC}$ into an input node 129 of the counting portion 126.

The supply current $I_{OSC}$ may be, for example, equal to a maximum current that may flow through a bit line $BL_i$, i.e.

the current that flows in the bit line $BL_i$ when all the memory cells associated to the bit line $BL_i$ are activated.

Alternatively, the supply current $I_{OSC}$ may have a different value, depending on the specific application.

The current mirror 128 has a mirroring ratio 1:p, so that the mirrored current that flows through the input node 129 of the counting portion 126 is $p \cdot I_{OSC}$.

In detail, the current mirror 128 has a first branch, here formed by a respective PMOS transistor 130, coupled to the current source 127, and a second branch, here formed by a respective PMOS transistor 131, coupled to the counting portion 126.

The sources of the PMOS transistors 130, 131 are coupled to a supply node 132, here at the voltage $V_{DD}$, the gates of the PMOS transistors 130, 131 are mutually coupled together and to the drain of the PMOS transistor 130. The drain of the PMOS transistor 131 is coupled to, in particular here is directly connected to, the input node 129 of the counting portion 126.

The counting portion 126 of the oscillator 120 comprises an integration stage 133, formed here by a first integration circuit 134, a second integration circuit 135 and a switching circuit 136 coupled between the first and the second integration circuits 134, 135, and a counter stage 137 which is coupled to the integration stage 133 and provides the timer signal TM<L:1>.

The first and the second integration circuits 134, 135 are coupled to the input node 129 so as to receive the mirrored current $p \cdot I_{OSC}$.

The first integration circuit 134 comprises a first inverter 140 having an output 141, a capacitor 142 of capacitance $C'_A$ coupled at the output 141 of the first inverter 140, and a second inverter 143 whose input is coupled to the output 141 of the first inverter 140.

The first inverter 140 has a supply node coupled to the input node 129 of the counting portion 126 (FIG. 7) and receives at input a first oscillator control signal $OS_A$.

In practice, the first inverter 140 is biased by the mirrored current $p \cdot I_{OSC}$.

The capacitor 142 has a first terminal coupled to the output node 141 of the first inverter 140 and a second terminal coupled to a reference potential node, here to ground.

The output node 141 of the first inverter 140 is at a first oscillator integration voltage $V'_A$ that drops across the capacitor 142.

The second inverter 143 has a first oscillator threshold $V'_{th1}$, hereinafter simply referred to as first threshold $V'_{th,1}$, receives at input the first oscillator integration voltage $V'_A$ and provides at output a first oscillator switch signal S'1 as a function of the first threshold $V'_{th1}$ and the first oscillator integration voltage $V'_A$.

In detail, when the first oscillator integration voltage $V'_A$ is smaller than the first threshold $V'_{th1}$, the first oscillator switch signal S'1 has a high logic value. When the first oscillator integration voltage $V'_A$ is higher than the first threshold $V'_{th1}$, the first oscillator switch signal S'1 has a low logic value.

The second integration circuit 135 comprises a first inverter 146 having an output 147, a capacitor 148 of capacitance C's coupled at the output 147 of the first inverter 146, and a second inverter 149 whose input is coupled to the output 147 of the first inverter 146.

The first inverter 146 has a supply node coupled to the input node 129 of the counting portion 126 (FIG. 7) and receives at input a second oscillator control signal $OS_B$.

In practice, the first inverter 146 is biased by the mirrored current p·$I_{OSC}$.

The capacitor 148 has a first terminal coupled to the output node 147 of the first inverter 146 and a second terminal coupled to a reference potential node, here to ground.

The output node 147 of the first inverter 146 is at a second oscillator integration voltage V's dropping across the capacitor 148.

The second inverter 149 has a second oscillator threshold V'$_{th2}$, hereinafter simply referred to as second threshold V'$_{th,2}$, receives at input the second oscillator integration voltage V's and provides at output a second oscillator switch signal S'2 as a function of the second threshold V'$_{th2}$ and the second oscillator integration voltage $V_B$.

In detail, when the second oscillator integration voltage $V_B$ is smaller than the second threshold V'$_{th2}$, the second oscillator switch signal S'2 has a high logic value. When the second oscillator integration voltage V's is higher than the second threshold V'$_{th2}$, the second oscillator switch signal S'2 has a low logic value.

In this embodiment, the first threshold V'$_{th1}$ of the second inverter 143 is equal to the first threshold V$_{th1}$ of the second inverter 48 of the digital detectors 22 (FIGS. 2 and 3). The second threshold V'$_{th2}$ of the second inverter 146 is equal to the second threshold V$_{th2}$ of the second inverter 53 of the digital detectors 22 (FIGS. 2 and 3).

Again with reference to FIG. 6, the switching circuit 136 is a latch formed by two inverters 150, 151 arranged in a ring configuration, a first switch 153 controlled by the first oscillator switch signal S'1 and a second switch 154 controlled by the second oscillator switch signal S'2.

The switching circuit 136 has a first node 156 coupled to the input of the inverter 151 and the output of the inverter 150, and a second node 157 coupled to the output of the inverter 151 and the input of the inverter 150.

The first node 156 provides the first oscillator control signal OS$_A$. The second node 157 provides the second oscillator control signal OS$_B$.

The first switch 153 is coupled between the first node 156 and a node at the voltage V'$_{DD}$, the second switch 154 is coupled between the second node 157 and the node at the voltage V'$_{DD}$.

According to an embodiment, the voltage V'$_{DD}$ of the counting portion 126 of the oscillator 120 may be equal to the voltage V'$_{DD}$ of the integration stage 33 of the digital detector 22 (FIG. 2).

In the embodiment of FIG. 6, the switching circuit 136 also receives an oscillator enable signal EN', which controls the activation of the switching circuit 136. For example, the oscillator enable signal EN' may be used to keep the switching circuit 136 off when not in use, thereby allowing to optimize power consumption. In addition, the enable signal EN' may be used to set the switching circuit 136 in a defined state, for example upon turning on of the IMC device 10. The counter stage 137 is coupled to the first and the second nodes 156, 157 of the switching circuit 136.

In detail, the charge counter stage 137 comprises an inverter 159, whose input is coupled to the second node 157, and a counter comprising an inverter 160 whose input is coupled to the first node 156 and a plurality of D flip-flops 161 including a first flip-flop 161.2, a second flip-flop 161.3 and a last flip-flop 161.L, wherein L is the number of bits of the timer signal TM<L:1>. In practice, the counter of the charge counter stage 137 has L−1 flip-flops 161.

The output of the inverter 159 provides the first bit TM(1), i.e. the least significant bit, of the timer signal TM.

The flip-flops 161 are cascaded one with the other, in sequence from the first flip 161.2 to the last flip-flop 161.L.

The flip-flops 161 each have a clock input (CK-input), a data input (D-input), a Q-output, and a $\overline{Q}$-output.

The CK-input of the first flip-flop 161.2 is coupled to the output of the inverter 160. The $\overline{Q}$-output of the first flip-flop 161.2 is fed back to the D-input of the first flip-flop 161.2. The Q-output of the first flip-flop 161.2 forms the second bit TM(2) of the timer signal TM<L:1>.

The CK-input of the second flip-flop 161.3 is coupled to the $\overline{Q}$-output of the first flip-flop 161.2. The $\overline{Q}$-output of the second flip-flop 161.3 is fed back to the D-input of the second flip-flop 161.3. The Q-output of the second flip-flop 161.3 forms the third bit TM(3) of the timer signal TM<L:1>.

What is described for the second flip-flop 161.3 applies, mutatis mutandis, to all the subsequent flip-flops, here not shown, up to the L−1-th flip-flop, also not shown.

Finally, the CK-input of the last flip-flop 161.L is coupled to the $\overline{Q}$-output of the L−1-th flip-flop. The $\overline{Q}$-output of the last flip-flop 161.L is fed back to the D-input of the last flip-flop 161.L. The Q-output of the last flip-flop 161.L forms the most significant bit TM(L) of the timer signal TM<L:1>.

With reference to the detailed implementation of the integration stage 133 shown in FIG. 7, the first inverter 140 of the first integration circuit 134 is a CMOS inverter formed by the series circuit of a PMOS transistor 165 and an NMOS transistor 166, mutually coupled at the output node 141. The PMOS and NMOS transistors 165, 166 receive the first oscillator control signal OS$_A$ at the respective gate terminals.

The source of the PMOS transistor 165 is coupled to the input node 129 of the integration stage 133 of the oscillator 120.

The second inverter 143 of the first integration circuit 134 is a CMOS inverter formed by the series circuit of a PMOS transistor 168 and an NMOS transistor 169, mutually coupled at a node 170 providing the first oscillator switch signal S'1.

The first threshold V'$_{th1}$ of the second inverter 143 is the switching threshold of the second inverter 143, and therefore depends on the properties, for example the threshold or the on-resistance, of the PMOS and NMOS transistors 168, 169. In practice, the switching threshold may be the input voltage for which the output of the inverter has the high logic value or the input voltage for which the output of the inverter has the low logic value.

For example, the switching threshold of the second inverter 143 may be defined as the operating point at which the respective input voltage, i.e. the first oscillator integration voltage V'A, is equal to the respective output voltage, i.e. the first oscillator switch signal S'1.

The first inverter 146 of the second integration circuit 135 is a CMOS inverter formed by the series circuit of a PMOS transistor 171 and an NMOS transistor 172, mutually coupled at the output node 173. The PMOS and NMOS transistors 172, 173 receive the second oscillator control signal OS$_B$ at the respective gate terminals.

The source of the PMOS transistor 171 is coupled to the input node 129 of the counting portion 126 of the oscillator 120.

The second inverter 149 of the second integration circuit 135 is a CMOS inverter formed by the series circuit of a PMOS transistor 175 and an NMOS transistor 176, mutually coupled at a node 177 providing the second oscillator switch signal S'2.

The second threshold $V'_{th2}$ of the second inverter 149 is the switching threshold of the second inverter 149, and therefore depends on the properties, for example the threshold or the on-resistance, of the PMOS and NMOS transistors 175, 176. In practice, the switching threshold may be the input voltage for which the output of the inverter has the high logic value or the input voltage for which the output of the inverter has the low logic value.

For example, the switching threshold of the second inverter 149 may be defined as the operating point at which the respective input voltage, i.e. the second oscillator integration voltage $V'_B$, is equal to the respective output voltage, i.e. the second oscillator switch signal $S'2$.

As shown in the detailed implementation of FIG. 7, the first and the second inverters 150, 151 of the switching circuit 136 are cross-coupled CMOS inverters each comprising a respective PMOS transistor 180 and a respective NMOS transistor 181 mutually coupled in series between a supply node, here at the voltage $V'_{DD}$, and ground.

Moreover, the first and the second inverters 150, 151 of the switching circuit 136 also comprise each a respective enabling switch, here a PMOS transistor 182, that is coupled between the supply node at the voltage $V'_{DD}$ and the PMOS transistor 180 of the respective inverter.

The PMOS transistors 182 are controlled by the oscillator enabling signal EN'.

In practice, in this embodiment, the oscillator 120, in particular the respective integration stage 133, has a circuit diagram that is equal to the circuit diagram of any one of the digital detectors 22 of FIGS. 2 and 3, in particular of the respective integration stage 33.

It follows that the oscillator 120 generates the timer signal TM<L:1> from the oscillator current $I_{OSC}$ in the same way as any one of the digital detectors 22 generates the output signal $y_1$ from the respective bit line current $I_{BL,i}$.

Thus, the oscillator 120 generates the timer signal TM<L:1> by performing a number of successive timing iterations. In each timing iteration, for example with respect to a timing iteration wherein the mirrored oscillator current $p \cdot I_{OSC}$ flows through the first integration circuit 134, the integration stage 133 generates the first integration oscillation voltage $V'_A$ as the time integral of the mirrored oscillator current $p \cdot I_{OSC}$, compares the first oscillator integration voltage $V'_A$ with the first threshold $V'_{th,1}$ and, in response to the first oscillator integration voltage $V'_A$ reaching the first threshold $V'_{th,1}$, resets the first oscillator integration voltage $V'_A$, in particular here by switching the first oscillator control signal $OS_A$. The counter stage 137 updates the timer signal TM<L:1> in response to the first oscillator integration voltage $V'_A$ reaching the first threshold $V'_{th,1}$.

In this embodiment, the least significant bit of the timer signal TM is the value of the second oscillator control signal $OS_B$.

In other words, the oscillator 120 samples the oscillator current $I_{OSC}$ by converting the oscillator current $I_{OSC}$ into a number of charge packets and counting said charge packets, wherein each charge packet corresponds to the charge accumulated on the capacitors 142, 148 that causes a switch of the second inverters 143, 149.

It follows that the timer signal TM<L:1> is updated at a frequency $f_u$ given by the switching events of the first oscillator control signal $OS_A$ (similarly to what is discussed for the first control signal $IN_A$ with reference to FIG. 4). The update frequency $f_u$ thus depends on the value of the oscillator current $I_{OSC}$, the mirror factor p of the current mirror 128, the capacitances $C'_A$, $C'_B$, and the first and second thresholds $V'_{th,1}, V'_{th,2}$ of the second inverters 143, 149.

Figure 8:
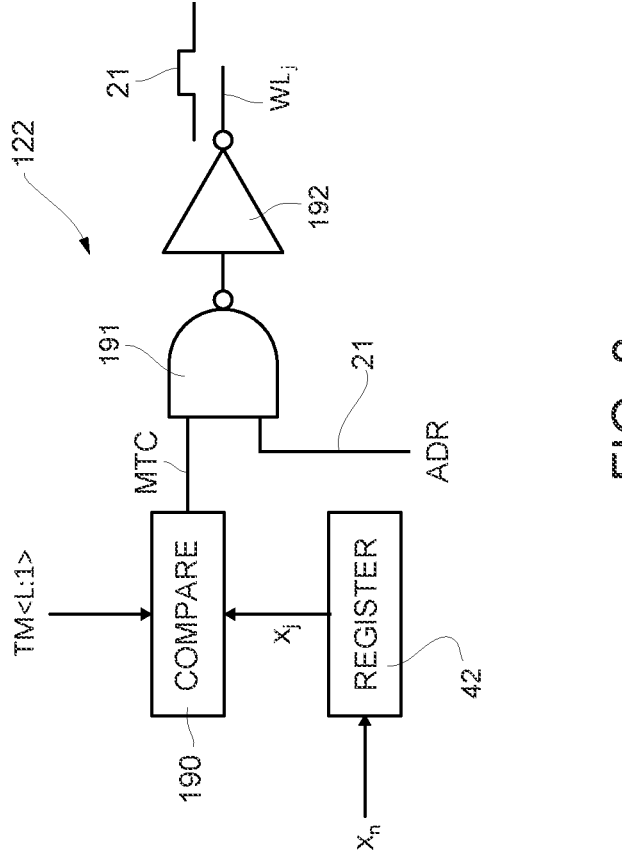
FIG. 8 shows a block diagram of a different portion of the in-memory computation device of FIG. 5.

FIG. 8 shows in detail an embodiment of the input-time converter 122 of a word line $WL_j$ of the plurality of word lines $WL_1, \ldots, WL_M$ comprising a comparator 190 receiving the timer signal TM<L:1> and the respective input value $x_j$ and providing, in response, a match signal MTC; and a pulse generation circuit, here formed by a NAND logic gate 191 and an inverter 192, providing the respective word line activation signal 21.

In this embodiment, the input value $x_j$ and the timer signal TM<L:1> are digital signals.

The comparator 190, for example a bit checking circuit based on a XOR logic gate, compares the input value $x_j$ and the timer signal TM<L:1> and asserts the match signal MTC to the high logic value when the timer signal TM<L:1> becomes equal to the input value $x_j$.

The NAND logic gate 191 receives the match signal MTC and an address enable signal ADR_EN indicating if the word line $WL_j$ has to be activated during the performance of an in-memory calculation. In detail, the address enable signal ADR_EN may have a high logic value if the word line $WL_j$ has to be activated during the in-memory calculation.

The inverter 192 is coupled at input to the output of the NAND logic gate 191 and provides at output the word line activation signal 21. In practice, the inverter 192 operates as a driver circuit for the respective word line $WL_j$.

With respect to word line $WL_j$, the input-time converter 122 keeps the respective word line activation signal 21 to the high logic value (i.e. thereby here activating the selection elements 26 of the memory cells 20 coupled to the word line $WL_j$) as long as the timer signal TM<L:1> is different from the input value $x_j$.

Therefore, the word line activation signals 21 each have a respective activation length $T_j$ that is proportional to the update frequency $f_u$ of the timer signal TM<L:1> and the respective input value $x_j$.

Figure 9:
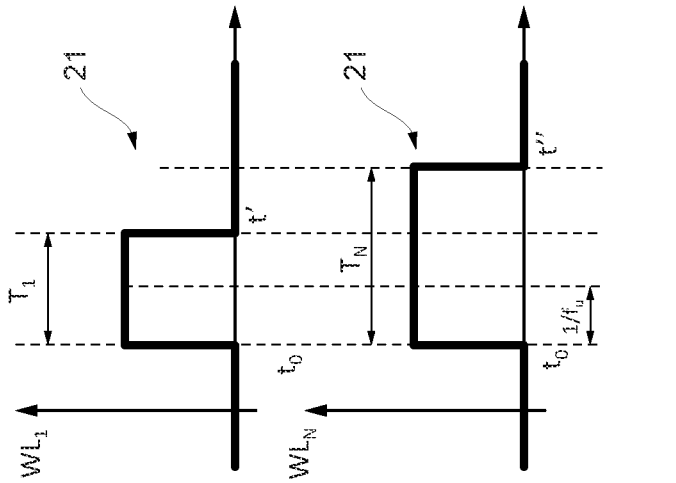
FIG. 9 shows an example of word line activation signals provided by the portion of FIG. 8.

FIG. 9 shows, by way of example, the word line activation signals 21 of the first word line $WL_1$ and the last word line $WL_N$. At the beginning of a computation by the IMC device 100 (instant $t_0$) the timer signal TM<L:1> of the oscillator 120 is reset to a start value, for example to zero, and the input-time converters 122 switch each the respective word line activation signal 21 to the high value.

In the example of FIG. 9, the input value $x_1$ associated to the first word line $WL_1$ is smaller than the input value $x_N$ associated to the last word line $WL_N$; therefore, the input-time converter 122 associated to the first word line $WL_1$ keeps the respective word line activation signal 21 to the high value for a time shorter with respect to the input-time converter 122 associated to the last word line $WL_N$. This results in the word line activation signal 21 of the first word line $WL_1$ having an activation length $T_1$ that is smaller than the activation length $T_N$ of the word line activation signal 21 of the last word line $WL_N$.

In use, the fact that the oscillator 120 generates the timer signal TM<L:1> from the oscillator current $I_{OSC}$ in the same way as the digital detectors 22 each generate the respective output signal $y_1$ from the respective bit line current $I_{BL,i}$, in particular the fact that the respective integration circuits 33, 133 have the same circuit diagram, allows to obtain a strong correlation between the timer signal TM<L:1> and the output signals $y_1, \ldots, y_M$.

Therefore, global variations that may affect the IMC device 100, such as drifts of the supply voltages $V_{DD}$, $V_{DD}$ and/or temperature variations, are compensated by the oscillator 120 and the digital detectors 22, without thereby affecting the precision of the MAC operation performed by the IMC device 100.

According to an embodiment, the oscillator 120 may comprise a computation-end comparator 193, as indicated by a dashed line in FIG. 5.

The computation-end comparator 193 receives the timer signal TM<L:1> and a max count signal MAX_COUNT<L:1> and provides, in response, an end-count signal END.

The max count signal MAX_COUNT<L:1> may be received from a user of the IMC device 10 and indicates the maximum duration of a calculation performed by the IMC device 10. For example, the max count signal MAX_COUNT<L:1> may indicate a maximum duration equal to or higher than the time that any of the output signals $y_1$ would take to reach the maximum value, e.g. all F bits equal to 1, when all the cells 20 associated to the bit line $BL_i$ are activated. However, the max count signal MAX_COUNT<L:1> may indicate a smaller maximum duration, for example if it is desired to obtain a shorter computation time by the IMC device 10.

In this case, the oscillator 120 may comprise, with reference to FIG. 7, a first and a second stop switches, here a first and a second NMOS transistors 194, 195, that are configured to stop the oscillator 120 from updating the timer signal TM.

In detail, the first and the second NMOS transistors 194, 195 have a drain terminal coupled to the output nodes 141, 173 of the first and, respectively, the second integration circuits 134, 135; and a source terminal coupled to a reference, here ground. The first and the second NMOS transistors 194, 195 receive, at the respective gate terminals, the end-count signal END.

When the timer signal TM<L:1> becomes equal to the max count signal MAX_CNT<L:1>, the end-computation comparator 195 switches the end signal END to the high logic value, thereby turning on the first and the second NMOS transistors 194, 195 and short-circuiting the output nodes 141, 173 of the first and the second integration circuits 134, 135 to ground.

Consequently, the oscillator 120 stops updating the timer signal TM.

Figure 10:
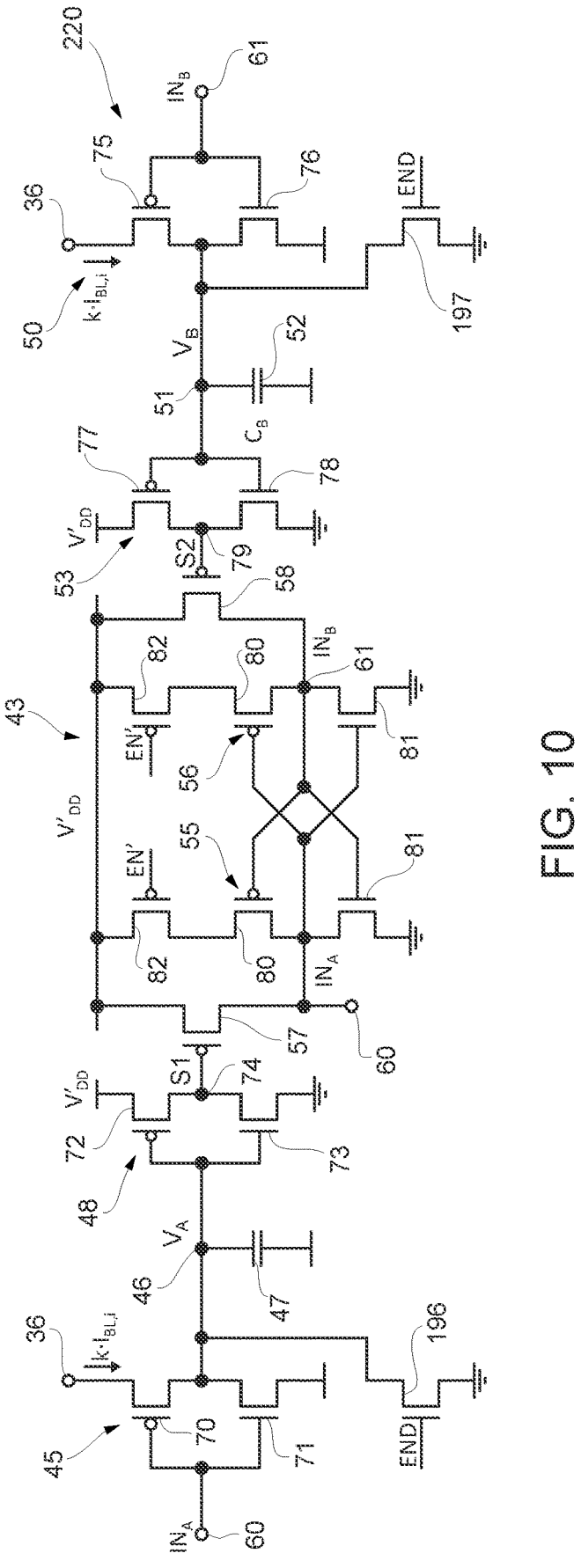
FIG. 10 shows a detailed circuit diagram of a portion of a digital detector of the in-memory computation device of FIG. 5.

FIG. 10 shows a different embodiment of the integration stage of any of the digital detectors 22 of the reading unit 16, here indicated as integration stage 220. The integration stage 220 differs from the integration stage 33 shown in FIG. 3 in that it comprises a first and a second stop switches, here a first and a second NMOS transistors 196, 197, that are configured to stop the digital detectors 22 from measuring the respective bit line current $I_{BL,i}$.

In detail, the first and the second NMOS transistors 196, 197 have a drain terminal coupled to the output nodes 46, 51 of the first and, respectively, the second integration circuits 41, 42; and a source terminal coupled to a reference, here ground. The first and the second NMOS transistors 196, 197 receive, at the respective gate terminals, the end-count signal END.

When the timer signal TM<L:1> becomes equal to the max count signal MAX_CNT<L:1>, the end-computation comparator 193 switches the end signal END to the high logic value, thereby turning on the first and the second NMOS transistors 196, 197 and short-circuiting the output nodes 46, 51 of the first and the second integration circuits 41, 42 to ground.

Consequently, the first and the second integration circuits 41, 42 stop integrating the bit line current $BL_i$.

In practice, the end-count signal END may be used to determine the end of the MAC calculation by the IMC device 100.

Figure 11:
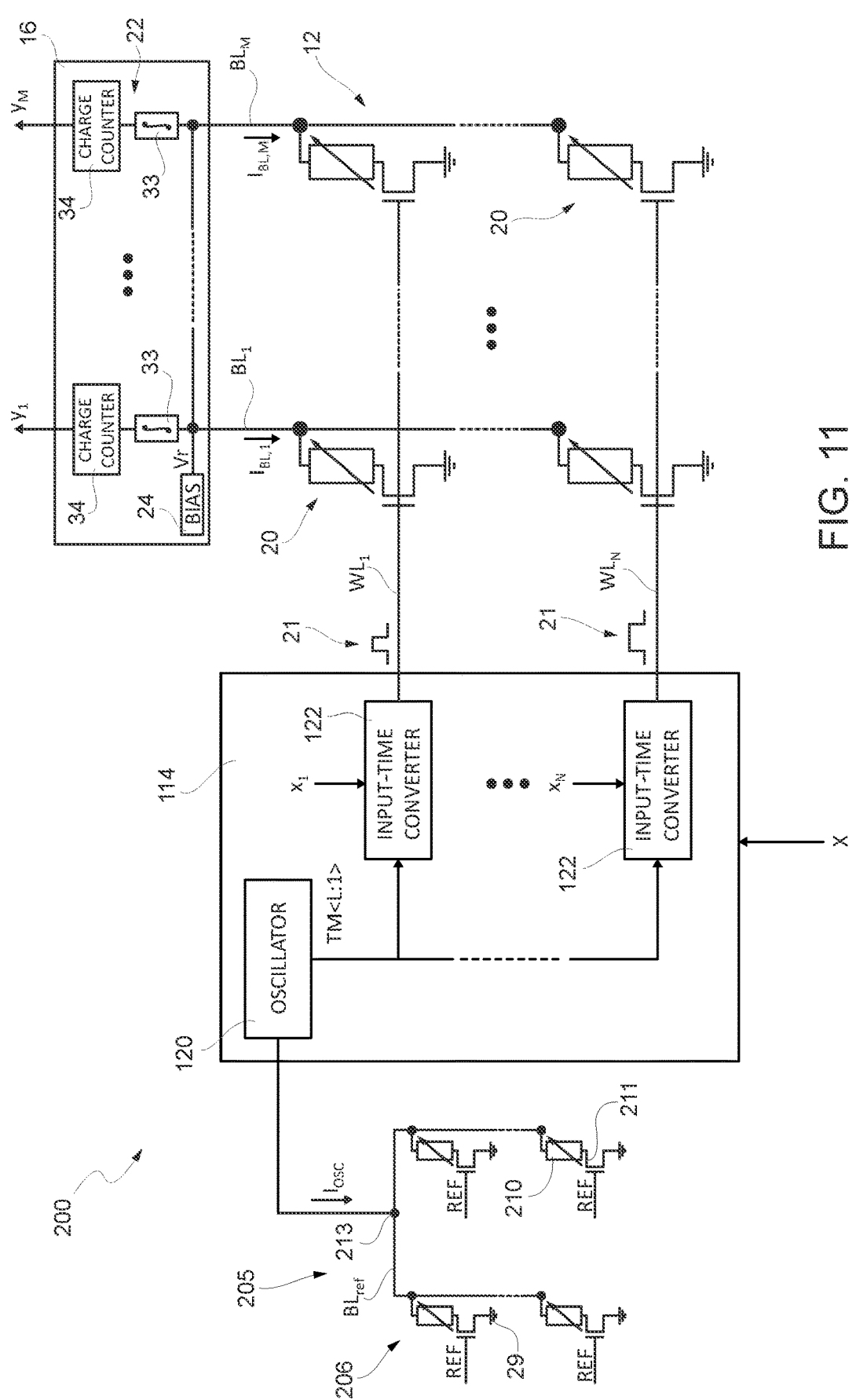
FIGS. 11 and 12 show block diagrams of the present in-memory computation device.

FIG. 11 shows a further embodiment of the present IMC device, here indicated by 200. The IMC device 200 has a general structure similar to the IMC device 100 of FIG. 5; therefore, elements in common are indicated by the same reference numbers and not further described.

In detail, the IMC device 200 comprises the memory array 12, the reading unit 16 and the word line activation unit 114.

The reading unit 16 comprises the plurality of digital detectors 22, one for each bit line $BL_i$.

The word line activation unit 114 comprises the oscillator 120 and the input-time converters 122 providing the word line activation signals 21.

The IMC device 200 further comprises a reference memory array 205 comprising one or more reference cells, here a plurality of reference cells 206, of the non-volatile type.

The reference memory array 205 may be a portion of the memory array 12 or may be a separate memory array.

The reference cells 206 have the same circuit configuration as the memory cells 20 of the memory array 12.

In detail, the reference cells 206 comprise each a storing element 210 and a selection element 211, in particular equal to the storing element 25 and, respectively, the selection element 26 of the memory cells 20.

In practice, the storing element 210 is based on the same technology that is used to obtain the storing element 25. For example, if the storing element 25 is based on a PCM material, then the storing element 210 is also based on a PCM material, in particular the same PCM material.

The reference cells 206 are programmed to store respective reference transconductance values, which may be equal or different to one another, depending on the specific application.

The number of reference cells 206 and the respective reference transconductance values may be chosen, at the design stage, so that the reference memory array 205 is a statistically significant sample of the memory array 12.

In practice, the reference memory array 205 has an overall reference transconductance value $g_{ref}$ that statistically represents an overall transconductance of the memory array 12.

For example, the overall transconductance of the memory array 12 may be equal to the transconductance that the memory array 12 would have if all the reference cells 20 are activated at the same time.

For example, the number of reference cells 206 may be higher than one hundred.

For example, the reference cells 206 may be programmed so that the overall transconductance $g_{ref}$ of the reference memory array 205 is equal to a mean value of the overall transconductance of the memory array 12.

For example, the mean value may represent the average transconductance value that the memory array 12 has in use, for example as determined during a calibration or initialization step of the IMC device 10.

The storing elements 210 have a first terminal that is coupled to a common node 213 and a second terminal coupled to a reference potential node, here to ground 29, through the selection element 211.

In practice, the reference cells 206 all share a same reference bit line $BL_{ref}$.

The selection elements 211 are each formed by a respective switch, here an NMOS transistor, that is arranged in series with the respective storing element 210.

In this embodiment, the selection elements 211 of all the reference cells 206 are controlled by a same reference activation signal REF, which for example may be generated by the word line activation unit 114 or by other components of the IMC device 200, here not shown.

However, the selection elements 211 may be controlled each by a respective reference activation signal, different one from the other, depending on the number of reference cells 206 that is intended to activate.

For example, the reference activation signal REF may keep all the reference memory cells 206 activated for the whole duration of a computation performed by the IMC device 10.

In this embodiment, with reference to the implementation of the oscillator 120 of FIG. 6, the reference memory array 205 forms the current source 127.

In detail, the common node 213 of the reference memory array 205 is coupled to the first branch of the current mirror 128, in particular to the drain of the PMOS transistor 130.

In practice, in use, the reference memory array 205 is biased by a fixed voltage, here the voltage $V_{DD}$ of the supply node 132, but the oscillator current $I_{OSC}$ depends on the transconductance values of the reference cells 206.

In use, the IMC device 200 may be subject to a temperature variation that may affect the transconductance values $g_{ij}$ of the memory cells 20. Moreover, the transconductance values $g_{ij}$ of the memory cells 20 may be subject to drifts; for example, in case the memory cells 20 are PCM memory cells, the storing elements 25 may be subject to aging phenomena such as amorphization.

Such deviations of the transconductance values $g_{ij}$ from the programmed values may change the bit line current $I_{BL,i}$, thereby causing errors in the output signal $y_1$.

However, such temperature variations or drifts would also affect, in the same way, the reference transconductance value $g_{ref}$ of the reference memory array 205, since the reference memory cells 206 represent a statistically significant sample of the memory cells 20.

A change in the reference transconductance value $g_{ref}$ would cause a change in the oscillator current $I_{OSC}$ and, therefore, a change in the update frequency $f_u$ of the timer signal TM<L:1> that compensate the change in the transconductance values $g_{ij}$ of the memory cells 20.

For example, if the memory cells 20 undergo a drift that causes an increase in the respective transconductance values $g_{ij}$, the corresponding bit line current $I_{BL,i}$ would also increase. At the same time, also the reference transconductance value $g_{ref}$ would increase, thereby causing an increase in the oscillator current $I_{OSC}$.

An increase in the oscillator current $I_{OSC}$ implies that the oscillator integration voltages $V'_A$, $V'_B$ (FIG. 7) increase faster; accordingly, also the first and the second oscillator control signals $OS_A$, $OS_B$ switch faster. In conclusion, also the update frequency $f_u$ of the timer signal TM<L:1> increases and, as a consequence, the activation length $T_j$ of the word line activation signals 21 decreases (FIG. 9).

In practice, the higher transconductance values $g_{ij}$ are compensated by inducing a reduced activation time of the word line $WL_j$, so that the bit line current $I_{BL,i}$ is, as a first approximation, not affected by the drift in the transconductance values $g_{ij}$.

Figure 12:
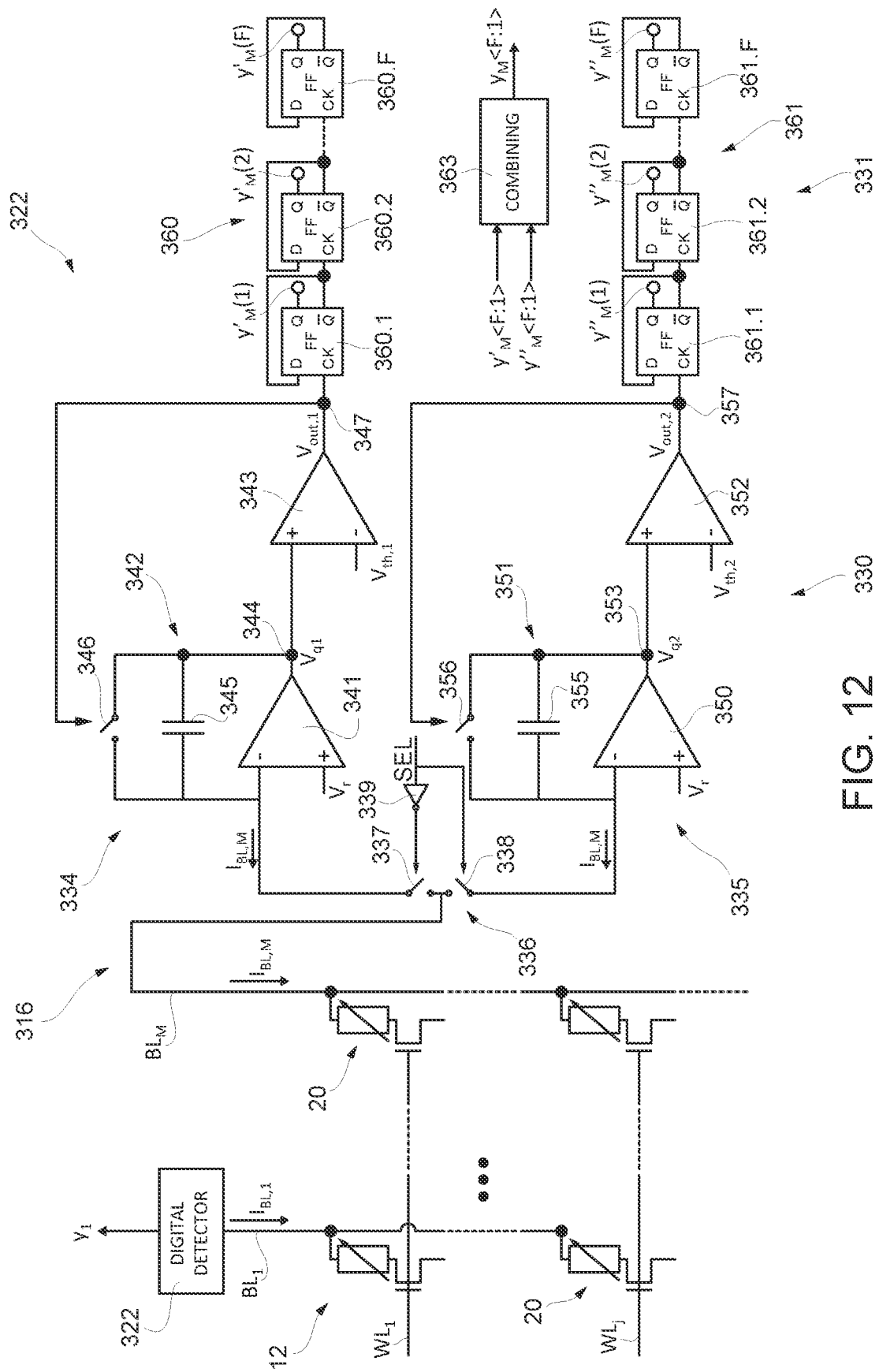

FIG. 12 shows a different embodiment of the present IMC device, here indicated by 300. The IMC device 300 has a general structure similar to the IMC devices 10, 100, 200; therefore, elements in common are indicated by the same reference numbers and are not further described.

FIG. 12 shows only the elements that are useful for understanding the present embodiment, whereas elements and components that may be present in the final IMC device 300 and are not relevant for understanding the present embodiment are not shown.

In detail, the IMC device 300 comprises the memory array 12 and a reading unit 316 having a plurality of digital detectors 322, one for each bit line $BL_1, \ldots, BL_M$.

By way of example, the digital detectors 322 will be described hereinafter with respect to the digital detector 322 of the bit line $BL_M$, which is shown in detail in FIG. 12.

The digital detector 322 comprises an integration stage 330 and a counter stage 331.

The integration stage 330 comprises a first integration circuit 334, a second integration circuit 335, and a switching circuit 336 coupled between the first and the second integration circuits 334, 335.

In detail, the switching circuit 336 comprises a first switch 337 and a second switch 338 that couple the bit line $BL_M$ to the first integration circuit 334 and, respectively, to the second integration circuit 335.

The first and the second switches 337, 338 are controlled by a selection signal SEL so that if the first switch 337 is open then the second switch 338 is closed and if the first switch 337 is closed then the second switch 338 is open.

In detail, in this embodiment, the switching circuit 336 further comprises an inverter 339 that receives the selection signal SEL and is coupled at output to the first switch 337.

In practice, the switching circuit 336 allows the bit line current $I_{BL,M}$ to flow either through the first integration circuit 334 or through the second integration circuit 335.

The first integration circuit 334 comprises a first operational amplifier 341, a feedback circuit 342, and a second operational amplifier 343.

The first operational amplifier 341 has an inverting input coupled to the first switch 337 of the switching circuit 336, receives a read voltage Vr at a non-inverting input, and has an output 344 providing a voltage $V_{q1}$.

The feedback circuit 342 is coupled between the inverting input and the output 344 of the first operational amplifier 341 and is formed by a parallel circuit comprising a feedback capacitor 345 and a switch 346.

The second operational amplifier 343 has the non-inverting input coupled to the output 344 of the first operational amplifier 341, receives the first sampling threshold voltage $V_{th,1}$ at the inverting input, and has an output 347 providing a first output voltage $V_{out1}$.

The commutation of the switch 346 is controlled by the first output voltage $V_{out,1}$.

The second integration circuit 335 comprises a first operational amplifier 350, a feedback circuit 351, and a second operational amplifier 352.

The first operational amplifier 350 has an inverting input coupled to the second switch 338 of the switching circuit 336, receives the read voltage Vr at a non-inverting input, and has an output 353 providing a voltage $V_{q2}$.

The feedback circuit 351 is coupled between the inverting input and the output 353 of the first operational amplifier 350 and is formed by a parallel circuit comprising a feedback capacitor 355 and a switch 356.

The second operational amplifier 352 has the non-inverting input coupled to the output 353 of the first operational amplifier 350, receives the second sampling threshold voltage $V_{th,2}$ at the inverting input, and has an output 357 providing a second output voltage $V_{out,2}$.

The commutation of the switch 356 is controlled by the second output voltage $V_{out,2}$.

The first and the second threshold voltages $V_{th,1}$, $V_{th,2}$ are here equal; however, the first and the second threshold voltages $V_{th,1}$, $V_{th,2}$ may be different one from the other.

The charge counter stage 331 comprises a first counting circuit, here formed by a plurality of flip-flops 360, coupled to the first integration circuit 334, and providing a first intermediate output signal $y'_M$; and a second counting circuit, here formed by a plurality of flip-flops 361, coupled to the second integration circuit 335, and providing a second intermediate output signal $y''_M$.

In detail, the flip-flops 360 are D flip-flops and include a first flip-flop 360.1, a second flip-flop 360.2 and a last flip-flop 360.F, wherein F is the number of bits of the first intermediate output signal $y'_M$.

The flip-flops 360 are cascaded one with the other, in sequence from the first flip-flop 360.1 to the last flip-flop 360.F.

The flip-flops 360 each have a clock input (CK-input), a data input (D-input), a Q-output, and a Q̄-output.

The CK-input of the first flip-flop 360.1 is coupled to the output 347 of the second operational amplifier 343. The Q̄-output of the first flip-flop 360.1 is fed back to the D-input of the first flip-flop 360.1. The Q-output of the first flip-flop 360.1 forms the least significant bit $y'_M(1)$ of the first intermediate output signal $y'_M$.

The CK-input of the second flip-flop 360.1 is coupled to the Q̄-output of the first flip-flop 360.1. The Q̄-output of the second flip-flop 360.2 is fed back to the D-input of the second flip-flop 360.2. The Q-output of the second flip-flop 360.2 forms the second bit $y'_M(2)$ of the first intermediate output signal y'M.

What is described for the second flip-flop 360.2 applies, mutatis mutandis, to all the subsequent flip-flops 360, here not shown, up to the F−1-th flip-flop, also not shown.

Finally, the CK-input of the last flip-flop 360.F is coupled to the Q̄-output of the F−1-th flip-flop. The Q̄-output of the last flip-flop 360.F is fed back to the D-input of the last flip-flop 360.F. The Q-output of the last flip-flop 360.F forms the most significant bit $y'_M(F)$ of the first intermediate output signal y'M.

The flip-flops 361 are D flip-flops and include a first flip-flop 361.1, a second flip-flop 361.2 and a last flip-flop 361.F, wherein F is the number of bits of the second intermediate output signal $y''_M$.

The flip-flops 361 are cascaded one with the other, in sequence from the first flip-flop 361.1 to the last flip-flop 361.F.

The flip-flops 361 each have a clock input (CK-input), a data input (D-input), a Q-output, and a Q̄-output.

The CK-input of the first flip-flop 361.1 is coupled to the output 357 of the second operational amplifier 352. The Q-output of the first flip-flop 361.1 is fed back to the D-input of the first flip-flop 361.1. The Q-output of the first flip-flop 361.1 forms the least significant bit $y''_M(1)$ of the second intermediate output signal $y''_M$.

The CK-input of the second flip-flop 361.1 is coupled to the Q-output of the first flip-flop 361.1. The Q-output of the second flip-flop 361.2 is fed back to the D-input of the second flip-flop 361.2. The Q-output of the second flip-flop 361.2 forms the second bit $y''_M(2)$ of the second intermediate output signal $y''_M$.

What is described for the second flip-flop 361.2 applies, mutatis mutandis, to all the subsequent flip-flops 361, here not shown, up to the F−1-th flip-flop, also not shown.

Finally, the CK-input of the last flip-flop 361.F is coupled to the Q̄-output of the F−1-th flip-flop. The Q̄-output of the last flip-flop 361.F is fed back to the D-input of the last flip-flop 361.F. The Q-output of the last flip-flop 361.F forms the most significant bit $y'_M(F)$ of the second intermediate output signal $y''_M$.

The digital detector 322 further comprises a combination unit 363 that receives the first intermediate output signal $y'_M$ from the flip-flops 360 and the second intermediate output signal $y''_M$ from the flip-flops 361 and provide, in response, the output signal $y_M$. For example, the combination unit 363 may provide the output signal $y_M$ by summing the first and the second intermediate output signals $y'_M$, $y''_M$. In use, the switching circuit 336 makes the bit line current $I_{BL,M}$ to flow either in the first or in the second integration circuit 334, 335.

Figure 13:
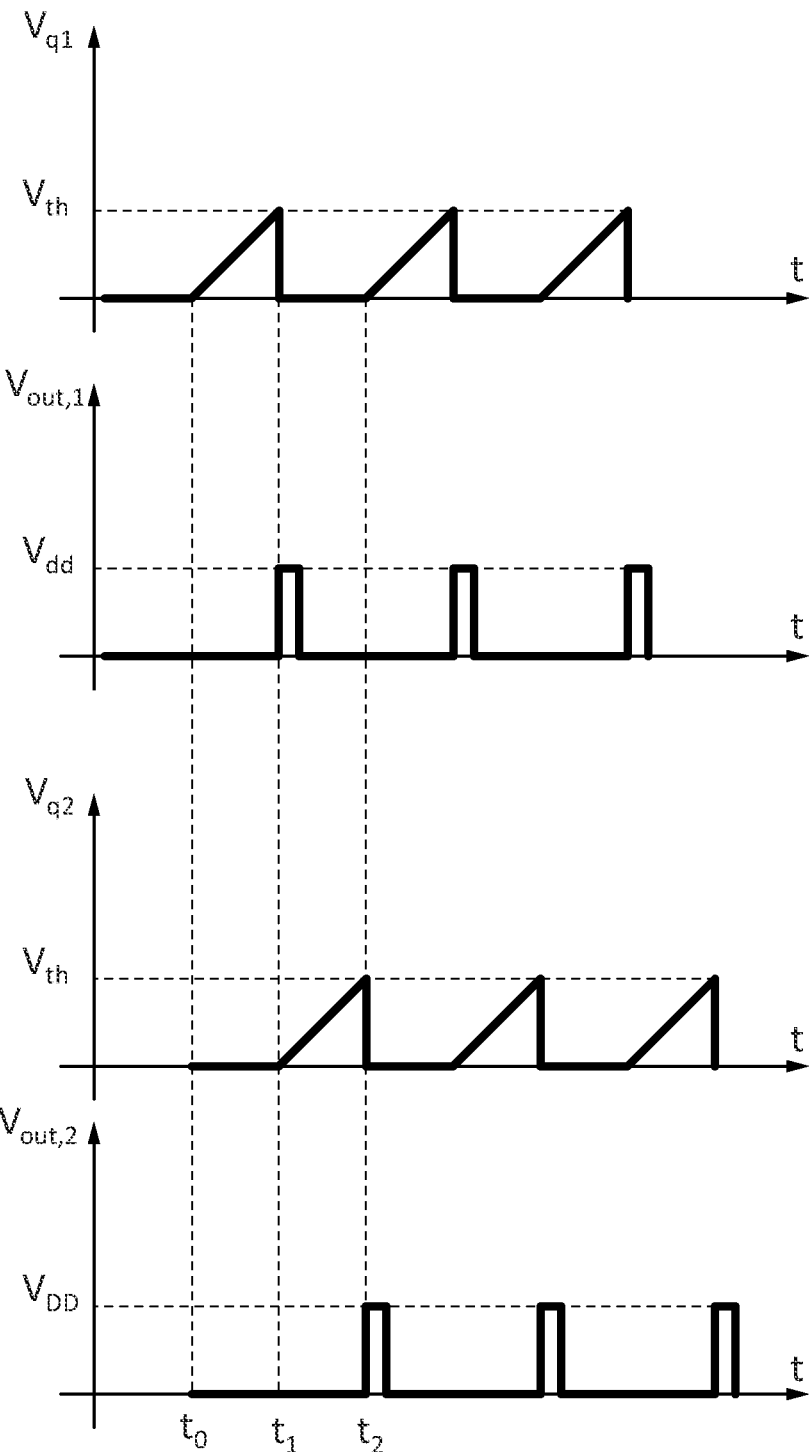
FIG. 13 shows an example of waveforms of a digital detector of the in-memory computation device of FIG. 12, in use.

With reference to the example of FIG. 13, at to, the first switch 337 is closed and the second switch 338 is open.

Thus, the bit line $BL_M$ is biased by the read voltage Vr at the non-inverting input of the first operational amplifier 341 of the first integration circuit 334.

Moreover, at $t_0$, the first output voltage $V_{out,1}$ and the second output voltage $V_{out,2}$ have the low logic value, thereby keeping the switches 346, 356 open.

The bit line current $I_{BL,M}$ charges the capacitor 345 of the first integration circuit 334.

Thus, the voltage $V_{q1}$ at the output 344 of the first operational amplifier 341 increases in time.

When the voltage $V_{q1}$ reaches the threshold voltage $V_{th}$ (instant $t_1$), the second operational amplifier 343 switches the first output voltage $V_{out,1}$ to the high logic value, here to $V_{DD}$.

In response, the switch 346 closes, thereby discharging the capacitor 345 of the first integration circuit 334. Accordingly, the voltage $V_{q1}$ at the output 344 decreases.

Moreover, in response to the first output voltage $V_{out,1}$ assuming the high logic value, the selection signal SEL switches, thereby opening the first switch 337 and closing the second switch 338 of the switching circuit 336.

Therefore, at instant $t_1$, the bit line $BL_M$ is coupled to the second integration circuit 335 and biased by the read voltage Vr at the non-inverting input of the first operational amplifier 350.

The bit line current $I_{BL,M}$ flows through the second integration circuit 335, thereby charging the respective capacitor 355. The voltage $V_{q2}$ at the output 353 of the first operational amplifier 350 increases.

When the voltage $V_{q2}$ reaches the threshold voltage $V_{th}$ (instant $t_2$), the second operational amplifier 352 switches the second output voltage $V_{out,2}$ to the high logic value, here to $V_{DD}$.

In response, the switch 356 closes, thereby discharging the capacitor 355 of the second integration circuit 335. Accordingly, the voltage $V_{q2}$ at the output 353 decreases.

Moreover, in response to the first output voltage $V_{out,1}$ assuming the high logic value, the selection signal SEL switches, thereby opening the first switch 337 and closing the second switch 338 of the switching circuit 336.

Therefore, similarly to what has been discussed above with reference to the instant $t_1$, at the instant $t_2$ the bit line current $I_{BL,M}$ flows again through the first integration circuit 334. The voltage $V_{q1}$ thus starts increasing.

The flip-flops 360 count the number of rising events of the first output voltage $V_{out,1}$, i.e. the number of times the voltage $V_{q1}$ becomes equal to the threshold voltage $V_{th}$.

The flip-flops 361 count the number of rising events of the second output voltage $V_{out,2}$, i.e. the number of times the voltage $V_{q2}$ becomes equal to the threshold voltage $V_{th}$.

In practice, also in this embodiment, the digital detectors 322 each measure the bit line current $I_{BL,i}$ of the respective bit line $BL_i$ by performing a number of successive respective sampling iterations. In each sampling iteration, for example with respect to a sampling iteration wherein the bit line current $I_{BL,i}$ flows through the first integration circuit 334, the integration stage 330 generates the integration voltage $V_{q1}$ as the time integral of the bit line current $I_{BL,i}$, compares the integration voltage $V_{q1}$ with the first threshold $V_{th,1}$ and, in response to the integration voltage $V_{q1}$ reaching the first threshold $V_{th,1}$, resets the integration voltage $V_{q1}$, in particular here by closing the switch 346. The counter stage 331 updates the output signal $y_i$ in response to the integration voltage $V_{q1}$ reaching the first threshold $V_{th,1}$.

Similarly to what is discussed for the capacitors 47, 52 of the digital detectors 22 (FIG. 2), the capacitors 345, 355 may have a small capacitance value and the bit line current $I_{BL,i}$ may be measured while the bit line current $I_{BL,i}$ flows through the respective bit line $BL_i$.

It is clear that the IMC devices 10, 100, 200, 300 may be subject to modifications and variations without departing the scope of the present invention, as defined in the attached claims.

Figure 14:
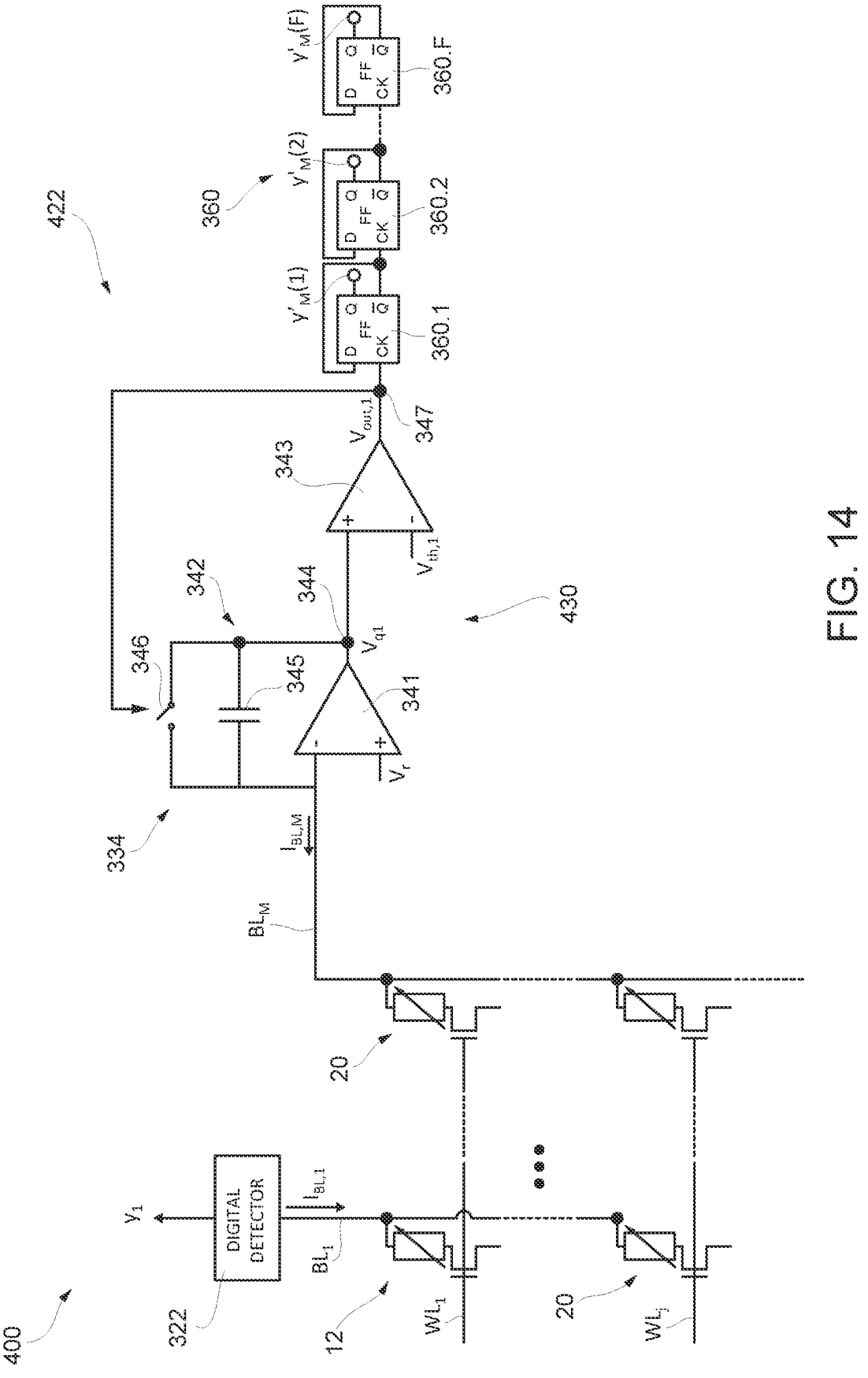
FIG. 14 shows a block diagram of the present in-memory computation device.

For example, the integration stage 33, 330 of the digital detectors 22, 322 may comprise only one integration circuit, thereby without even comprising the respective switching circuit. For example, FIG. 14 shows a different embodiment of the IMC device, here indicated by 400, wherein, differently from the IMC device 300 of FIG. 12, the digital detectors, here indicated by 422, comprise each only the first integration circuit 334 and the first counter circuit 360. In practice, the digital detectors 422 of FIG. 14 do not comprise the switching circuit 336, the second integration circuit 335 and the second counter circuit 361 discussed with reference of FIG. 12.

The integration stage of each digital detector may be coupled to the respective bit line $BL_i$ differently from what shown and described here; for example, the integration stage 33 of FIG. 2 may be coupled to the bit line $BL_i$ without the current mirror 35, so that the integration stage 33 receives at the input node 36 directly the bit line current $I_{BL,i}$.

The integration stage 133 of the oscillator 120 may have the same circuit diagram as the integration stage 33, 330, 430 of any of the digital detectors 22, 322, 422, i.e. they may have equal circuit elements providing the integration signal and equal circuit elements providing the control signal from the integration signal.

In other words, for example as discussed above with reference to FIGS. 2 and 6, the integration stage of the oscillator and the digital detector may each have a first inverter and a capacitor providing the integration signal and a second inverter providing the control signal that is used by the respective counter stage.

In this case, the capacitors of the integration stage of the digital detector and the capacitor of the integration stage of the oscillator may have the same capacitance value; and/or the first inverter of the integration stage of the digital detector may be equal to the first inverter of the integration stage of the oscillator; and/or the second inverter of the integration stage of the digital detector may be equal to the second inverter of the integration stage of the oscillator, e.g. having the same switching threshold.

The integration stage of the oscillator and the digital detector may each have only one integration circuit (for example similarly to what is discussed with reference to FIG. 14) or a first and a second integration circuit mutually coupled by a switching circuit.

The memory cells 20 may be resistive memory cells not based on PCM materials, but on different technologies; for example, may be magnetoresistive (MRAM), resistive (RRAM) or static (SRAM) memory cells.

Moreover, the storing element 25 of each memory cell 20 may be formed by a plurality of selectable resistive elements, equal or different from each other, mutually arranged in parallel, for example between the respective bit line and ground, that may be selectively enabled or disabled during programming of the memory array 12, so that the respective transconductance value $g_{ij}$ may be a multibit value.

Finally, the illustrated embodiments may be combined to provide further solutions. For example, the oscillator may have the same circuit diagram as the digital detector of FIG. 12 or 14.

For example, the charge counter stage 34 of the digital detectors 22 (FIG. 2) may comprise a second set of flip-flops, instead of the inverter 63, coupled to the second node 61 of the switching circuit 43, and a combination unit, similarly to what is described with reference to FIG. 12.

In addition or as an alternative, the charge counter stage 137 of the oscillator 120 (FIG. 6) may comprise a second set of flip-flops, instead of the inverter 159, coupled to the second node 157 of the switching circuit 136, and a combination unit, similarly to what is described with reference to FIG. 12.

For example, with reference to FIG. 12, the operational amplifiers 343 or 352 may be replaced by an inverter, as in the digital detectors 22 of FIG. 2. In practice, the integration stage and the counter stage of the digital detectors may each be formed by a combination of the elements forming the digital detectors 22, 322 of FIGS. 2, 12. Similar considerations apply, mutatis mutandis, to the integration stage and the counter stage of the oscillator, which, according to an embodiment, may have the same circuit diagram as the integration stage and counter stage of the digital detectors.

The invention claimed is:

1. An in-memory computation device, comprising:
a word line activation unit configured to receive an input signal indicative of a plurality of input values and to provide a plurality of activation signals, each activation signal being a function of a respective input value;
a memory array comprising a plurality of memory cells coupled to a bit line and coupled each to a respective word line, the memory cells being configured to store a respective computational weight and to receive a respective activation signal from the respective word line, wherein a respective cell current flows through each memory cell as a function of the respective activation signal and the respective computational weight, and wherein a bit line current flows through the bit line as a function of a summation of the cell currents; and
a digital detector coupled to the bit line and configured to provide at least one output signal from the bit line current;
wherein the digital detector comprises an integration stage and a counter stage configured to perform a number of successive sampling iterations;
wherein, in each sampling iteration:
the integration stage is configured to generate an integration signal indicative of a time integral of the bit line current, compare the integration signal with a sampling threshold, and reset the integration signal in response to the integration signal reaching the sampling threshold; and
the counter stage is configured to update the at least one output signal in response to the integration signal reaching the sampling threshold.

2. The in-memory computation device according to claim 1, wherein the integration stage comprises:

a first inverter having an output providing the integration signal; and an integration capacitive element coupled at the output of the first inverter;

wherein the first inverter is configured to receive a biasing current indicative of the bit line current.

3. The in-memory computation device according to claim 2, wherein the first inverter has an input configured to receive a control signal indicative of the integration signal reaching the sampling threshold, and wherein the first inverter is configured to charge the integration capacitive element with the biasing current in response to a first value of the control signal and to discharge the integration capacitive element in response to a second value of the control signal.

4. The in-memory computation device according to claim 3, wherein the integration stage comprises a second inverter having a switching threshold and configured to receive the integration signal, wherein the sampling threshold is the switching threshold of the second inverter.

5. The in-memory computation device according to claim 1, wherein the integration stage comprises:

a first operational amplifier having a first input and an output; and an integration capacitive element coupled between the first input of the first operational amplifier and the output of the first operational amplifier;

wherein the first operational amplifier is configured to receive, at the first input, a current indicative of the bit line current.

6. The in-memory computation device according to claim 5, wherein the integration stage further comprises:

a second operational amplifier having a first input and a second input and configured to receive the integration signal at the first input and the sampling threshold at the second input.

7. The in-memory computation device according to claim 1, wherein the integration signal is a first integration signal and the sampling threshold is a first sampling threshold, the integration stage comprising:

a first integration circuit configured to generate the first integration signal, compare the first integration signal with the first sampling threshold and reset the first integration signal;

a second integration circuit; and a switching circuit coupled between the first and the second integration circuits;

wherein the second integration circuit is configured to generate a second integration signal indicative of a time integral of the bit line current, compare the second integration signal with a second sampling threshold and reset the second integration signal in response to the second integration signal reaching the second sampling threshold;

wherein the counter stage is configured to update the at least one output signal also in response to the second integration signal reaching the second threshold;

wherein the switching circuit is configured to disable the first integration circuit and enable the second integration circuit in response to the first integration signal reaching the first threshold, and to enable the first integration circuit and disable the second integration circuit in response to the second integration signal reaching the second threshold.

8. The in-memory computation device according to claim 1, wherein the word line activation unit comprises:

an oscillator; and a plurality of input-time converters;

wherein the oscillator is configured to provide a timer signal from an oscillator current;

wherein each input-time converter is configured to generate the respective activation signal in response to the timer signal and a respective input value;

wherein the oscillator comprises an integration stage and a counter stage configured to perform a number of successive timing iterations, wherein, in each timing iteration:

the integration stage is configured to generate a respective integration signal indicative of a time integral of the oscillator current, compare the integration signal with an oscillator threshold, and reset the integration signal in response to the integration signal reaching the oscillator threshold; and the counter stage is configured to update the timer signal in response to the integration signal reaching the oscillator threshold.

9. The in-memory computation device according to claim 8, wherein the integration stage of the oscillator has a same circuit diagram as the integration stage of the digital detector.

10. The in-memory computation device according to claim 8, further comprising:

a reference memory array coupled to a reference bit line, the reference memory array configured to have a reference transconductance value and configured to provide a reference current that is a function of the reference transconductance value;

wherein the reference memory array is a statistically significant sample of the memory array; and wherein the oscillator is coupled to the reference bit line and configured to provide the timer signal from the reference current.

11. The in-memory computation device according to claim 1, wherein the integration stage of the digital detector is configured to stop performing the sampling iterations in response to receiving an end-computation signal.

12. The in-memory computation device according to claim 11, wherein the word line activation unit is configured to compare a timer signal with a maximum count signal and, in response, to provide the end-computation signal.

13. The in-memory computation device according to claim 1, wherein the activation signals are each a pulse signal having a duration that is a proportional function of the respective input value.

14. The in-memory computation device according to claim 1, wherein the memory cells each have a current path comprising a storing element and a selection element and extending between a common node and a reference potential node, the selection element being configured to selectively close the respective current path as function of the respective activation signal.

15. The in-memory computation device according to claim 1, wherein the memory cells are non-volatile memory cells.

16. A method for controlling an in-memory computation device that is configured to receive an input signal indicative of a plurality of input values and provide at least one output signal;

wherein the in-memory computation device comprises a word line activation circuit, a memory array and a digital detector, the digital detector being coupled to the bit line and comprising an integration stage and a counter stage, the memory array comprising a plurality of memory cells coupled to a bit line and coupled each to a respective word line, the memory cells being configured to store each a respective computational weight and to receive each a respective activation signal from the respective word line, wherein a respective cell current flows through each memory cell as a function of the respective activation signal and the respective computational weight, and wherein a bit line current flows through the bit line as a function of a summation of the cell currents;

the method comprising:

providing, by the word line activation circuit, a plurality of activation signals to the memory cells, wherein each activation signal is a function of a respective input value; and performing, by the digital detector, a number of successive sampling iterations;

wherein each sampling iteration comprises, by the integration stage:

generating an integration signal indicative of a time integral of the bit line current;

comparing the integration signal with a sampling threshold; and resetting the integration signal in response to the integration signal reaching the sampling threshold; and wherein each sampling iteration further comprises, by the counter stage, updating the at least one output signal in response to the integration signal reaching the sampling threshold.

\* \* \* \* \*